(12) United States Patent
Park et al.

(10) Patent No.: US 8,497,569 B2
(45) Date of Patent: Jul. 30, 2013

(54) PACKAGE SUBSTRATES AND SEMICONDUCTOR PACKAGES HAVING THE SAME

(75) Inventors: Jin-Woo Park, Seoul (KR); Hwan-Sik Lim, Gunpo-si (KR); Eunchul Ahn, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 39 days.

(21) Appl. No.: 13/042,855

(22) Filed: Mar. 8, 2011

(65) Prior Publication Data

US 2011/0215444 A1    Sep. 8, 2011

(30) Foreign Application Priority Data

Mar. 8, 2010    (KR) .................. 10-2010-0020504

(51) Int. Cl.
*H01L 21/311* (2006.01)
(52) U.S. Cl.
USPC .......................................... 257/629
(58) Field of Classification Search
USPC .................. 257/734–738, 629, 678
See application file for complete search history.

(56) References Cited

U.S. PATENT DOCUMENTS

| 5,182,631 | A  | * | 1/1993 | Tomimuro et al. | 257/664 |
| 6,060,778 | A  | * | 5/2000 | Jeong et al. | 257/710 |
| 6,278,128 | B1 | * | 8/2001 | Noji et al. | 257/48 |
| 6,444,494 | B1 | * | 9/2002 | Muramatsu et al. | 438/110 |
| 6,472,727 | B2 | * | 10/2002 | Miyazaki et al. | 257/668 |
| 6,642,083 | B2 | * | 11/2003 | Miyazaki et al. | 438/117 |
| 6,664,135 | B2 | * | 12/2003 | Miyazaki et al. | 438/123 |
| 6,861,760 | B2 | * | 3/2005 | Oka et al. | 257/777 |
| 6,897,142 | B2 | * | 5/2005 | Fujimori et al. | 438/615 |

FOREIGN PATENT DOCUMENTS

| JP | 2006-344822 | 12/2006 |
| JP | 2009-152317 | 7/2009 |
| KR | 10-2008-0074468 A | 8/2008 |

* cited by examiner

*Primary Examiner* — Nathan Ha
(74) *Attorney, Agent, or Firm* — Stanzione & Kim, LLP

(57) ABSTRACT

A package substrate, a semiconductor package having the same, and a method for fabricating the semiconductor package. The semiconductor package includes a semiconductor chip, a package substrate, and a molding layer. The package substrate provides a region mounted with the semiconductor chip. The molding layer is configured to mold the semiconductor chip. The package substrate includes a first opening portion that provides an open region connected electrically to the semiconductor chip and extends beyond sides of the semiconductor chip to be electrically connected to the semiconductor chip.

27 Claims, 30 Drawing Sheets

PACKAGE SUBSTRATES AND SEMICONDUCTOR PACKAGES HAVING THE SAME

CROSS-REFERENCE TO RELATED APPLICATIONS

This U.S. non-provisional patent application claims priority under 35 U.S.C. §119(a) from Korean Patent Application No. 10-2010-0020504, filed on Mar. 8, 2010, the entire contents of which are hereby incorporated by reference.

BACKGROUND

1. Field of the Invention

The present disclosure herein relates to semiconductors, and more particularly, to a package substrate, a semiconductor package having the same, and a method of fabricating the semiconductor package.

2. Description of the Related Art

A flip-chip mounting method is widely used to mount a semiconductor chip on a package substrate such as a printed circuit board (PCB). The flip-chip mounting method forms solder balls or solder bumps as connection terminals on the top surface of a semiconductor chip and mounts the semiconductor chip on a package substrate by facing down the semiconductor chip to the package substrate and bonding the connection terminals to terminals or interconnections formed at the package substrate.

A semiconductor package may be formed by forming a molding layer that molds the semiconductor chip mounted on the package substrate. Typically, before the forming of the molding layer, a capillary is used to form an underfilling layer via a gap between the semiconductor chip and the package substrate. However, forming a void-free underfilling layer in the packaging is becoming an important issue in the semiconductor industry.

SUMMARY

The present disclosure provides a semiconductor package and a method of fabricating the same, which can form an underfilling layer without void.

Additional features and utilities of the present general inventive concept will be set forth in part in the description which follows and, in part, will be obvious from the description, or may be learned by practice of the present general inventive concept.

The present disclosure also provides a package substrate with an improved design that can suppress the generation of a void or can shift an inevitably-generated void.

To this end, the general inventive concept forms a molding layer and an underfilling layer of a semiconductor package simultaneously through a molded underfill (MUF) process. The inventive concept also improves the design of a package substrate to form a void-free underfilling layer. The inventive concept also traps an inevitably-generated void at a point that does not affect the operation of a semiconductor chip.

In another exemplary embodiment of the inventive concept, package substrates include: a substrate mounted with a semiconductor chip; and a passivation layer disposed on the substrate and having a first opening portion that provides an open region connected electrically to the semiconductor chip, wherein the first opening portion extends more than a region necessary to electrically connect to the semiconductor chip.

In some embodiments, the first opening portion intersects the center of the substrate in one direction.

In other exemplary embodiments, the passivation layer further includes a second opening portion that provides an open region that is not electrically but mechanically connected to the semiconductor chip.

In further exemplary embodiments, the second opening portion occupies an edge portion of the substrate.

In still further exemplary embodiments, the first opening portion is connected to the second opening portion to extend to the edge portion of the substrate, or is defined in a center portion of the substrate without being connected to the second opening portion.

In still further exemplary embodiments, the package substrates further including one of a first dam disposed on the passivation layer to occupy an edge portion of the substrate to surround a portion of the outer wall of the semiconductor chip, and a second dam disposed under the semiconductor chip.

In another exemplary embodiment of the inventive concept, semiconductor packages include: a semiconductor chip; a package substrate providing a region mounted with the semiconductor chip; and a molding layer configured to mold the semiconductor chip, wherein the package substrate includes a first opening portion that provides an open region connected electrically to the semiconductor chip and extends more than a region necessary of electrical connection to the semiconductor chip.

In another exemplary embodiment, the semiconductor chip includes a first surface with an electrical connection terminal and a support terminal disposed thereon and a second surface opposite to the first surface, and is flip-mounted on the package substrate with the first surface facing the package substrate.

In other exemplary embodiments, the electrical connection terminal is provided in plurality across the center of the semiconductor chip, and the first opening portion is disposed across the center of the package substrate while being vertically aligned with the electrical connection terminals.

In further exemplary embodiments, the support terminal is provided in plurality at the edge of the semiconductor chip, and the package substrate further includes a plurality of second opening portions aligned vertically with the support terminals.

In still further exemplary embodiments, the first opening portion is connected to at least one of the second opening portions.

In still further exemplary embodiments, the package substrate includes a passivation layer, and the first and second opening portions are formed by removing a portion of the passivation layer.

In still further exemplary embodiments, the package substrate further includes one of a first dam surrounding a portion of the outer wall of the semiconductor chip, and a second dam disposed under the semiconductor chip.

In still further exemplary embodiments, the first dam has a height identical to or different from the size of a gap between the package substrate and the semiconductor chip, and is disposed at the edge of the package substrate to be spaced apart from the side of the semiconductor chip by a predetermined distance.

In still further exemplary embodiments, the second dam has a height smaller than the size of a gap between the package substrate and the semiconductor chip, and is disposed on the package substrate to be spaced apart from the first opening portion.

In still further exemplary embodiments, the molding layer includes an underfilling layer filling a gap between the semiconductor chip and the package substrate, and the underfilling layer is formed of the same material as the molding layer.

In further exemplary embodiments of the inventive concept, semiconductor packages include: a semiconductor chip including a top surface with an electrical connection terminal and a support terminal disposed thereon and a bottom surface opposite to the top surface; a package substrate providing a region mounted with the semiconductor chip; and a molding layer molding the semiconductor chip and filling a gap between the semiconductor chip and the package substrate, wherein the package substrate further includes a second opening portion connected to the support terminal, wherein the semiconductor chip is faced down with the top surface facing the package substrate, the electrical connection terminal is electrically connected through the first opening portion to the package substrate, and the support terminal is connected through the second opening portion to the package substrate to mechanically support the semiconductor chip on the package substrate. Herein, the package substrate may include a substrate mounted with a semiconductor chip; and a passivation layer disposed on the substrate and having a first opening portion that provides an open region connected electrically to the semiconductor chip, wherein the first opening portion extends more than a region necessary of electrical connection to the semiconductor chip.

In another exemplary embodiment, the first opening portion has the shape of a straight line that extends in one direction (A) cross the center of the package substrate.

In other exemplary embodiments, the first opening portion is connected to the second opening portion to further extend to the edge of the package substrate.

In further exemplary embodiments, the package substrate further includes a dam disposed on the passivation layer, and the dam is disposed outside the gap to surround a portion of the outer wall of the semiconductor chip while being spaced apart from the side of the semiconductor chip by a predetermined distance, or is disposed in the gap under the semiconductor chip.

In still further exemplary embodiments, the molding layer includes an underfilling layer filling the gap, and the underfilling layer includes voids trapped at a point deviating from the first opening portion.

In still further exemplary embodiments of the inventive concept, methods of fabricating a semiconductor package include: providing a semiconductor chip including an electrical connection terminal; providing a package substrate including a first opening portion providing an open region that extends more than a region connected to the electrical connection terminal; mounting the semiconductor chip on the package substrate to connect the electrical connection terminal through the first opening portion to the package substrate; and providing a molding resin by a pressure and vacuum environment to form a molding layer molding the semiconductor chip, wherein the molding resin is also provided to a gap between the package substrate and the semiconductor chip to form an underfilling layer, filling the gap, simultaneously with the forming of the molding layer.

In another exemplary embodiment, the forming of the underfilling layer includes flowing the molding resin, which flowed into the gap, in the first opening portion, wherein the extended region of the first opening portion causes the flow resistance of the molding resin in the first opening portion to become lower than the flow resistance of the molding resin in the gap.

In other exemplary embodiments, the forming of the underfilling layer includes: forming a cavity, which is not filled with the molding resin, at the center of the gap by flowing the molding resin toward the center of the gap while flowing the molding resin from the top to the bottom of the semiconductor chip; and forming the underfilling layer by continuing to provide the molding resin to the gap by the pressure and vacuum to disappear the cavity.

In further exemplary embodiments, the providing of the package substrate includes: providing a substrate including a dam that surrounds a portion of the outer wall of the semiconductor chip at the edge of the package substrate or is disposed in the gap to be spaced apart from the first opening portion.

In still further exemplary embodiments, the forming of the underfilling layer includes: forming a cavity, which is not filled with the molding resin, in the gap at a point adjacent to the dam by changing the flow amount of the molding resin flowing from the top into the bottom of the semiconductor chip by the dam; and continuing to provide the molding resin to disappear the cavity to form the underfilling layer, wherein voids are generated and trapped at the point that is adjacent to the dam by being spaced apart from the first opening portion.

Still further exemplary embodiments including a substrate including a semiconductor chip comprises a passivation layer disposed on the substrate, and at least one center portion included with the passivation layer and having an open region that extends beyond the edge region to connect electrically to the semiconductor chip.

In yet further exemplary embodiments a package substrate comprises a passivation layer including a first opening portion that provides an open region, at least one dam having a predetermined height and being coupled to the passivation layer, and a chip disposed on the at least one dam to define a gap having a gap width between the chip and the passivation layer.

In still further exemplary embodiments, a method of fabricating a semiconductor package containing a semiconductor chip comprises forming a passivation layer having boundary edges defining a peripheral thereof and having an edge connection region within the boundary sides, forming an opening extending through the passivation layer and extending along a width of the passivation layer to extend between the edge connection regions and the respective boundary sides, and disposing the semiconductor chip on the passivation layer such that the opening extends beyond opposite sides of the semiconductor

BRIEF DESCRIPTION OF THE DRAWINGS

The above and/or other features of the present general inventive concept will become apparent and more readily appreciated from the following description of exemplary embodiments, taken in conjunction with the accompanying drawings, in which.

DETAILED DESCRIPTION OF THE EMBODIMENTS

Figure 1A:
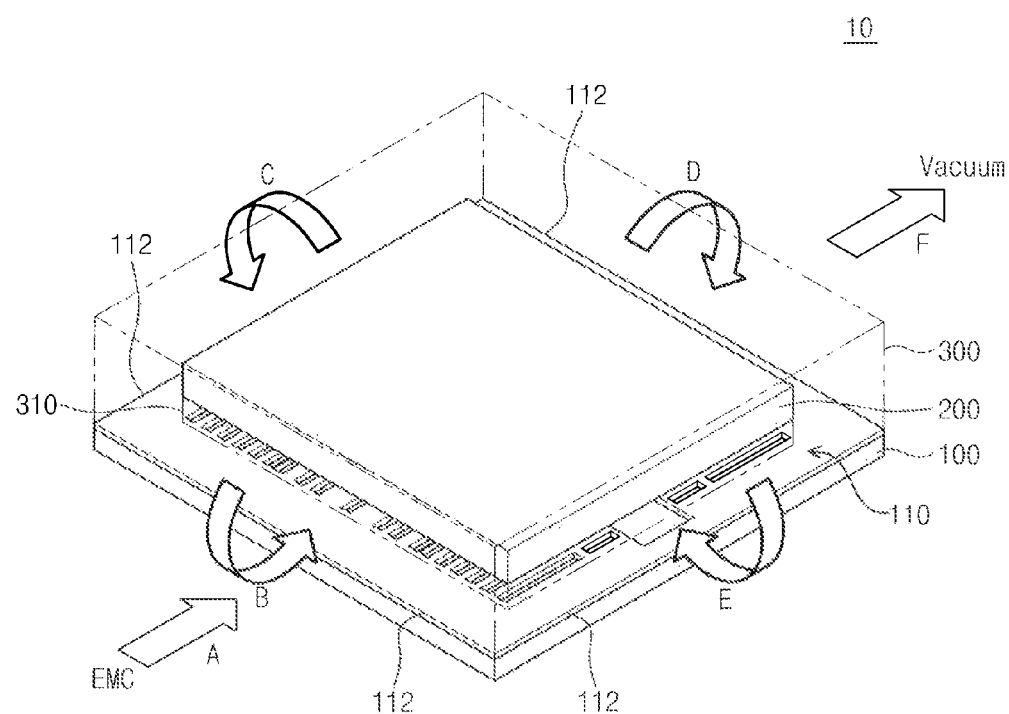
FIG. 1A is a perspective view of a semiconductor package according to some embodiments of the general inventive concept.

Preferred embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Reference will now be made in detail to exemplary embodiments of the present general inventive concept, examples of which are illustrated in the accompanying drawings, wherein like reference numerals refer to the like elements throughout. The exemplary embodiments are described below in order to explain the present general inventive concept by referring to the figures.

Hereinafter, a package substrate, a semiconductor package having the same, and a method of fabricating the semiconductor package according to exemplary embodiments of the inventive concept will be described in detail with reference to the accompanying drawings.

Example of SR Open Design

Figure 1B:
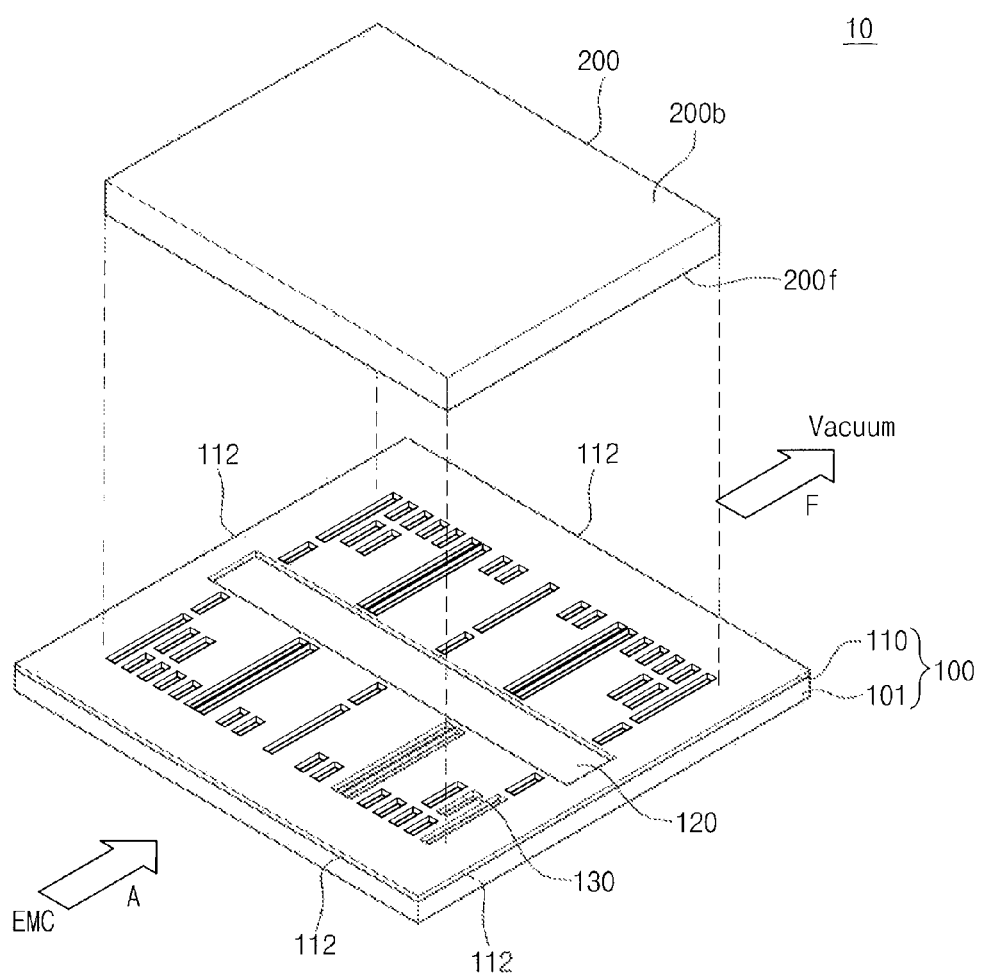
FIG. 1B is an exploded perspective view of FIG. 1A.
Figure 1C:
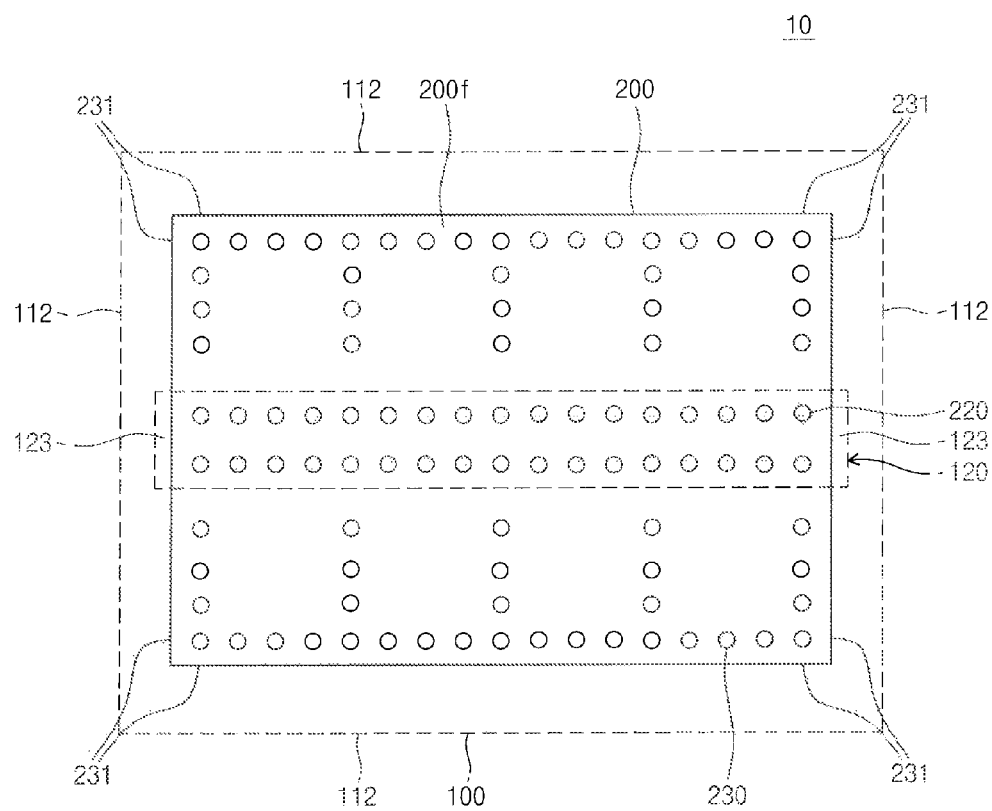
FIG. 1C is a plan view of the bottom surface of a semiconductor chip in the semiconductor package of FIG. 1A.

FIG. 1A is a perspective view of a semiconductor package according to exemplary embodiments of the general inventive concept. FIG. 1B is an exploded perspective view of FIG. 1A. FIG. 1C is a plan view of the bottom surface of a semiconductor chip in the semiconductor package of FIG. 1A.

Referring to FIG. 1A, a semiconductor package 10 may include a package substrate 100, a semiconductor chip 200 mounted on the package substrate 100 and a molding layer 300 configured to mold the semiconductor chip 200. The semiconductor package 10 may be a flip-chip package having the semiconductor chip 200 mounted on the package substrate 100. The molding layer 300 may be configured to mold the semiconductor chip 200 and underfill a gap (G) between the semiconductor chip 200 and the package substrate 100.

Referring to FIG. 1B, the package substrate 100 may be a single-layer or multi-layer printed circuit board (PCB). For example, the package substrate 100 may include a conducting layer 101 having copper interconnection patterns and electrodes, and a passivation layer 110 surrounding one or both sides of the conducting layer 101 and protecting the interconnection patterns. The passivation layer 110 includes boundary edges 112 that define a periphery of the passivation layer 110. Further, the passivation layer 110 may be formed to have a desired pattern by coating a dielectric resin (e.g., a photo solder resist) on the conducting layer 101 and exposing/developing the coated dielectric resin.

The passivation layer 110 may have at least one first opening portion 120 in a linear shape of a '-' i.e., a lane, intersecting the center of the conducting layer 101. The first opening portion 120 may extend in a substantially perpendicular direction to an EMC flow direction (A) of providing an epoxy molding compound (EMC). As another example, the first opening portion 120 may extend in a direction that is identical to the EMC flow direction (A) or may extend at an angle with respect to the EMC direction (A). The passivation layer 110 may further have at least one second opening portion 130 that opens adjacent the edge of the conducting layer 101. The at least one opening portion 120 and/or 130, may be formed via a solder resist open (SRO) design. Accordingly, the fluidity of a molding resin can be improved, as described in greater detail below.

The semiconductor chip 200 may be mounted on the package substrate 100 by being positioned face down such that its top surface 200f faces the package substrate 100. This exemplary embodiment illustrates an example where the semiconductor chip 200 with a center pad structure is flip-mounted on the package substrate 100. However, the general inventive concept is not limited thereto. For example, the semiconductor chip 200 may have an edge pad structure or a matrix pad structure. The semiconductor chip 200 may be a memory device or a non-memory device. For example, the semiconductor chip 200 may be a Flash memory device or a DRAM device that has a center pad structure.

Referring to FIGS. 1C and 1B, the semiconductor chip 200 may have terminals 220 such as solder bumps or solder balls arranged in one or more lines across the center of the top surface 200f. The terminals 220 are connected to the interconnection patterns formed at the package substrate 100 so that the semiconductor chip 200 may be electrically connected to the package substrate 100. The semiconductor chip 200 may further include a plurality of support terminals 230. The support terminals 230 may be provided to more securely support the semiconductor chip 200 on the package substrate 100 without contributing to the electrical connection. For example, the support terminals 230 may be formed adjacent to an edge of the top surface 200f of the semiconductor chip 200, which defines an edge connection region 231 to more securely support the edge of the semiconductor chip 200 to which a thermal and/or physical stress may be applied relatively more than to other portions. When the semiconductor chip 200 is flip-mounted on the package substrate 100, the terminals 220 may be arranged along the first opening portion 120 and the support terminals 230 may be arranged along the second opening portion 130. Accordingly, the first opening portion 120 may extend beyond the edge connection region 231 to connect the terminals 220, thereby providing an excess portion 123.

Referring back to FIG. 1A, the molding layer 300 may be formed through a molded underfill (MUF) process. For example, an epoxy molding compound (EMC) may be used as a molding resin, and the EMC may be provided in the EMC direction (A), which may face one side of the semiconductor chip 200. The EMC may be provided by applying a predetermined pressure in the EMC direction (A). As another example, the EMC may be provided by vacuuming an environment in a vacuum direction (F) while applying a predetermined pressure in the direction (A). The direction (F) may be substantially identical to the direction (A). The EMC provided in the EMC direction (A) may flow to the top and bottom of the semiconductor chip 200. Herein, the EMC may flow from the top to the bottom of the semiconductor chip 200 after flowing more to the top of the semiconductor chip 200, which has less flow resistance. In FIG. 1A, symbols B, C, D and E represent the flow paths of the EMC from the top into the bottom of the semiconductor chip 200. The EMC flowing from the top into the bottom of the semiconductor chip 200 may form an underfilling layer 310 that fills a gap (G) between the package substrate 100 and the semiconductor chip 200. Unless otherwise specified, the gap (G) means a region between the package substrate 100 and the semiconductor chip 200. Accordingly, since the MUF process forms the underfilling layer 310 together with the molding layer 300, a separate process to form the underfilling layer 310 (e.g., a capillary underfill process using a capillary pressure) may be excluded Accordingly, the package substrate 100 is SRO-designed to have the first opening portion 120, thus making it possible to form the molding layer 300 including the void-free underfilling layer 310.

Figure 1D:
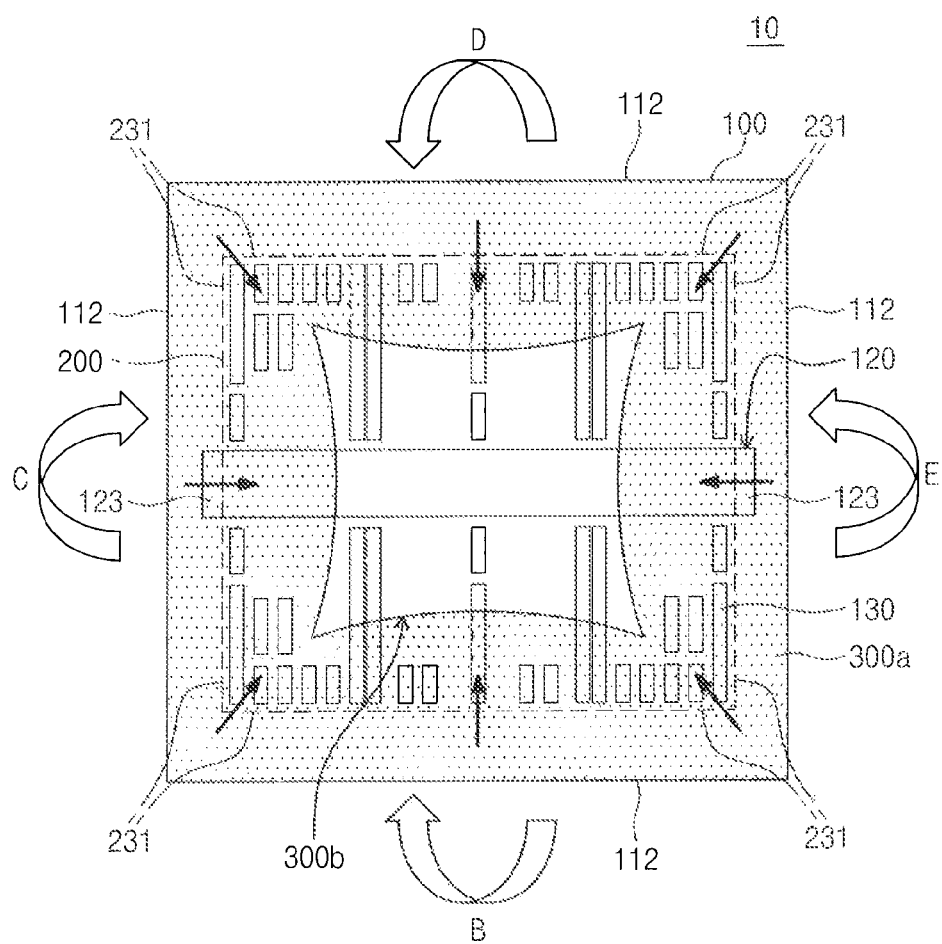
FIGS. 1D and 1E are plan views illustrating a molded underfill (MUF) process in a semiconductor package according to some embodiments of the general inventive concept.
Figure 1E:
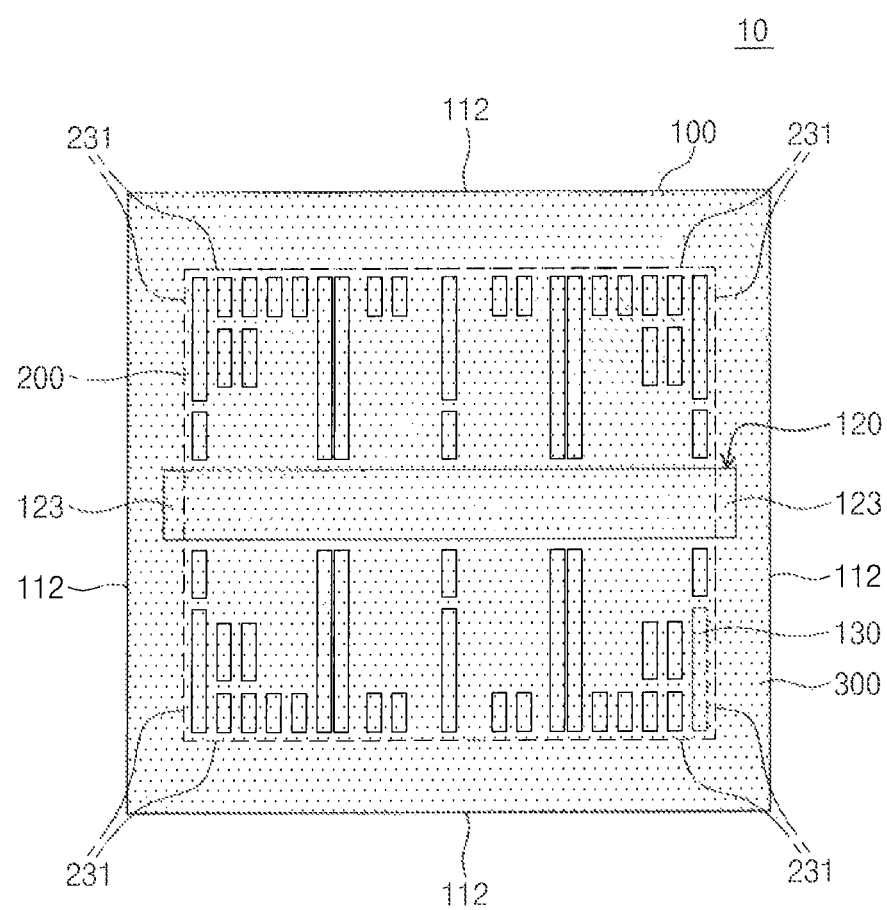
Figure 1F:
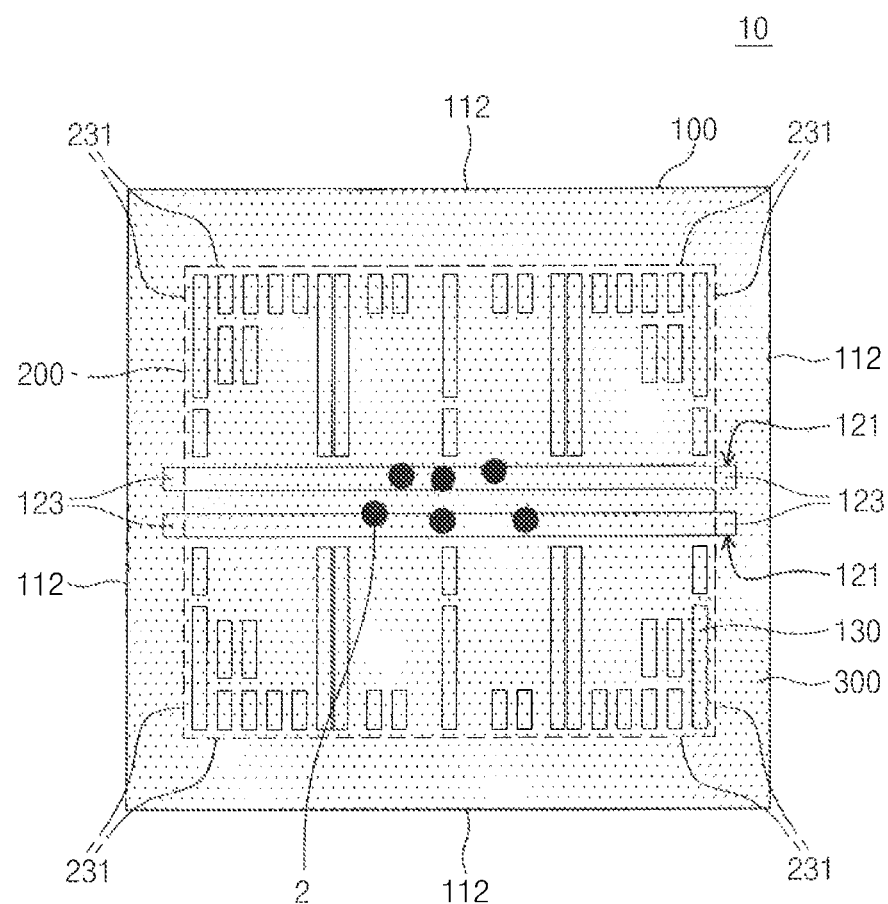
FIG. 1F is a plan view illustrating a typical MUF process.

FIGS. 1D and 1E are plan views illustrating a molded underfill (MUF) process in a semiconductor package according to an exemplary embodiment of the general inventive concept. FIG. 1F is a plan view illustrating a MUF process.

Referring to FIG. 1D, an EMC 300a may flow in the directions B, C, D and E i.e., four sides of the semiconductor chip 200, according to pressure and vacuum applied to the semiconductor package 10. Accordingly, the EMC 300a may flow toward the center by flowing into the gap (G). In FIG. 1D, a solid-line arrow represents a flow of the EMC 300a into the gap (G). The flow of the EMC 300a may vary according to the size of the gap (G). Typically, the EMC 300a flows at a high rate in a large-gap place with a low flow resistance, and flows at a low rate in a small-gap place with a high flow resistance. In particular, since the EMC 300a flows from the four sides into the center of the semiconductor chip 200, the resistance may be increased by the terminals disposed at the center of the semiconductor chip 200.

According to at least one exemplary embodiment, the extended first opening portion 120 capable of including all the terminals 220 is formed at the center of the package substrate 100 as illustrated in FIG. 1C. The extending first opening portion 120 provides a large gap between the package substrate 100 and the semiconductor chip 200 to reduce the flow resistance of the EMC 300a. In addition, the second opening portions 130 aligned vertically with the support terminals 230 of FIG. 1C are included in the package substrate 100 to further provide a gap (G) to facilitate the flow of the EMC 300a through the semiconductor passage 10.

Since the flow of the EMC 300a may have the same or similar flow rate due to the SRO design of the package substrate 100 including the first opening portion 120 and the second opening portion 130, a cavity 300b not yet filled with the EMC 300a may be formed mainly at the center of the gap (G).

Referring to FIGS. 1D and 1E, when the size of the cavity 300b decreases due to the continuous provision of the EMC 300a, very small cavities (i.e., voids) 300b may be trapped mainly at the center of the gap as illustrated in FIG. 1E. According to at least one exemplary embodiment, since the EMC 300a is provided by pressure and vacuum, the voids are removed by pressure to implement the semiconductor package 10 (such as a MUF flip-chip package) including the void-free molding layer 300 as illustrated in FIG. 1E.

Referring to FIG. 1F, when the package substrate 100 includes an unextended opening portion 121, the gap (G) does not extend and the resistance of the EMC flow increases relatively by the terminals located particularly at the center of the gap, thus implementing a semiconductor package 1 that includes the molding layer 300 with voids 2 trapped mainly at the center of the gap. In particular, if the semiconductor chip 200 has a center pad structure, when a thermal and/or mechanical stress is applied to the semiconductor package 1, the voids 2 formed at the center of the gap may transmit the stress to the terminals to damage the terminals. This may degrade the operation reliability of the semiconductor package 1. On the other hand, the semiconductor package 10 illustrated in FIG. 1E may secure the mounting reliability and the operation reliability because the fluidity of the EMC is improved by the extended first opening portion 120.

Example of Package Substrate

FIGS. 2A to 2J are perspective views illustrating various examples of a package substrate in a semiconductor package according to some embodiments of the general inventive concept.

Figure 2A:
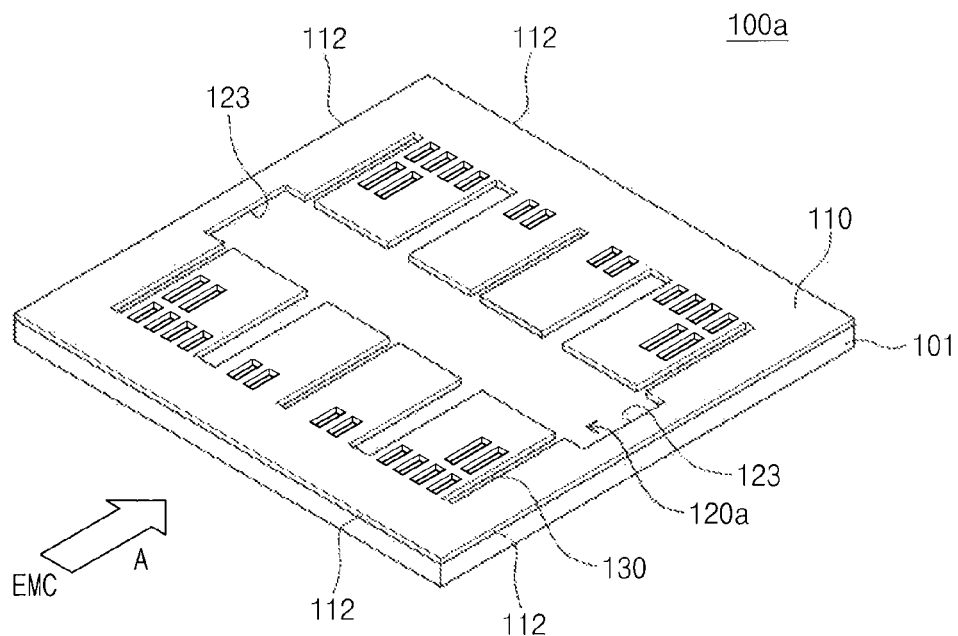
FIGS. 2A to 2J are perspective views illustrating various examples of a package substrate in a semiconductor package according to some embodiments of the general inventive concept.

Referring to FIG. 2A, a package substrate 100a may include an extended first opening portion 120a that connects to a second opening portion 130 and has a linear shape, i.e., '-' shape, such as a straight line, and intersects the center of the package substrate 100a. The connection between the extended first opening portion 120a and the second opening portion 130 can further improve the fluidity of the EMC from the edge to the center of the package substrate 100a. A description of duplication with the package substrate 100 of FIG. 1B is omitted for conciseness, and the same is true in the following description.

Figure 2B:
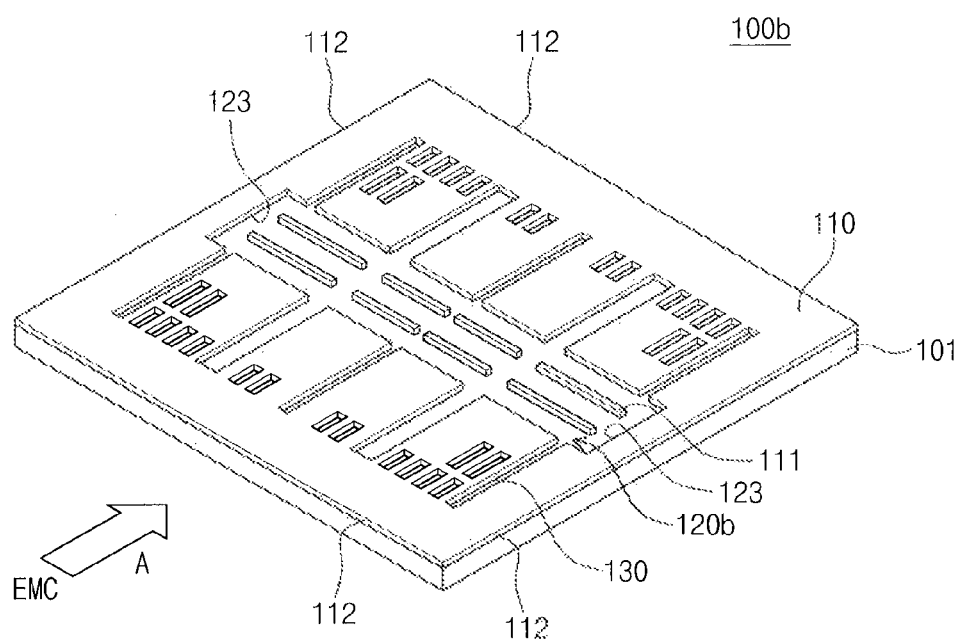

Referring to FIG. 2B, a package substrate 100c may include a '-'-shaped i.e., a linear-shaped, extended first opening portion 120b connected to a second opening portion 130. A pattern 111 constituted by a portion of a passivation layer 110 may be formed in the first opening portion 120b. The pattern 111 spatially divides the first opening portion 120b to secure the alignment location of the terminals arranged at the center of the semiconductor chip, and/or to control the flow rate of the EMC.

Figure 2C:
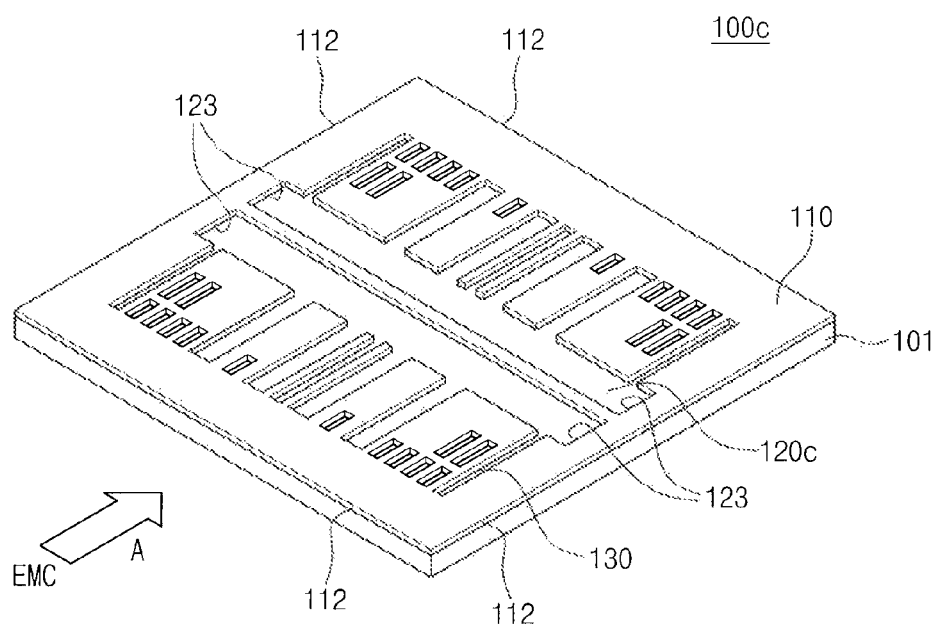

Referring to FIG. 2C, a package substrate 100c may include two '-'-shaped, i.e., linear-shaped, extended first opening portions 120c intersecting the center thereof. Each of the first opening portions 120c may be connected to a second opening portion 130. As another example, another opening portion may be further provided between the two first opening portions 120c.

Figure 2D:
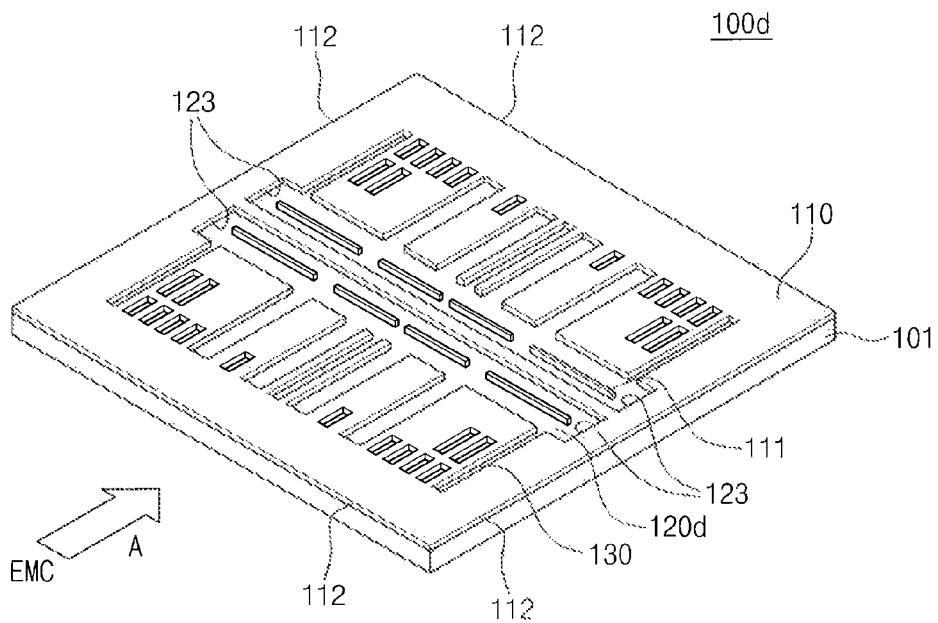

Referring to FIG. 2D, a package substrate 100d may include two '-'-shaped, i.e., linear-shaped, extended first opening portions 120d connected to a second opening portion 130. A pattern of ridges 111 may be formed in each of the first opening portions 120d to secure the alignment location of the terminals, or to control the flow rate of the EMC.

Figure 2E:
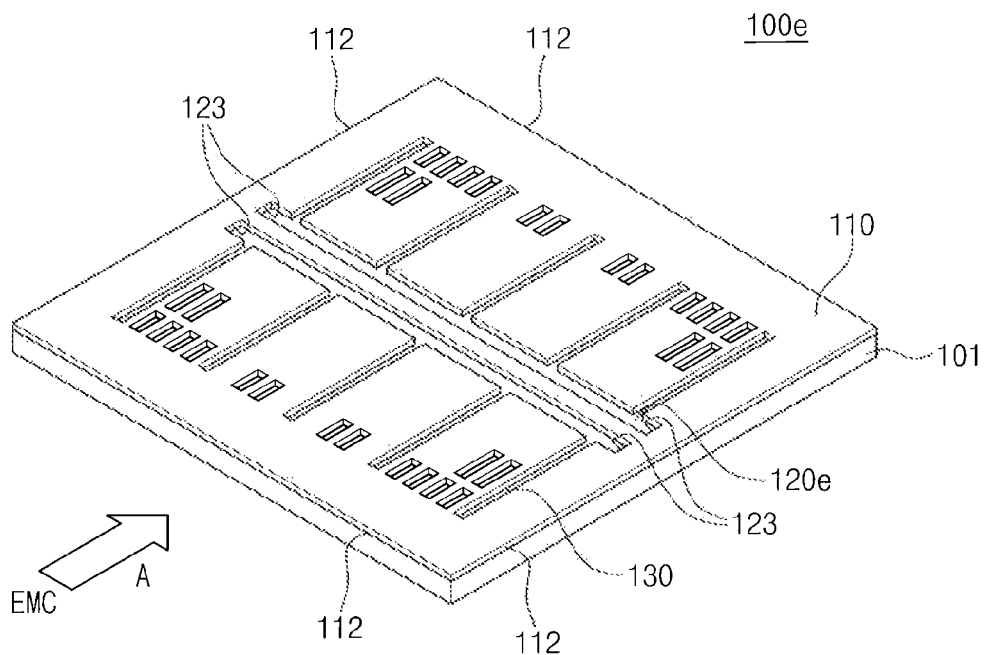

Referring to FIG. 2E, a package substrate 100e may include a '-'-shaped, i.e., linear-shaped, unextended first opening portion 120e. The first opening portion 120e is connected to a second opening portion 130 to extend the EMC flow path.

Figure 2F:
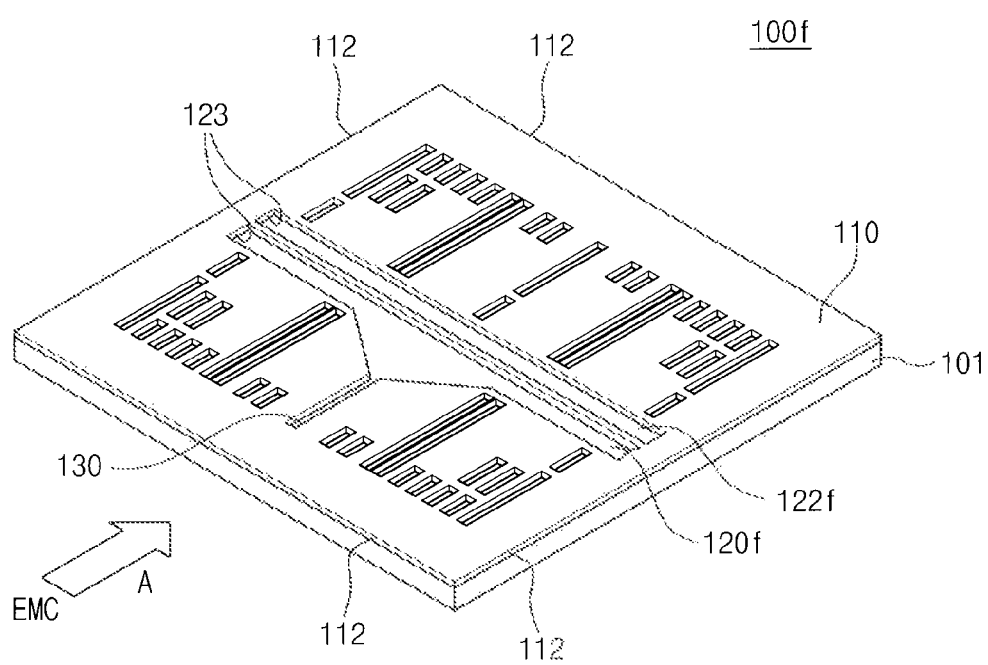

Referring to FIG. 2F, a package substrate 100f may include two '-'-shaped, i.e., linear-shaped, first opening portions 120f and 122f intersecting the center thereof. At least one of the first opening portions 120f and 122f may have an extended shape or an unextended shape. One of the first opening portions 120f and 122f, for example, the first opening portion 120f adjacent to the EMC providing side may include a triangular structure that has a center region connected to a second opening portion 130 and extends gradually toward the EMC providing direction (A) to improve the fluidity of the EMC.

Figure 2G:
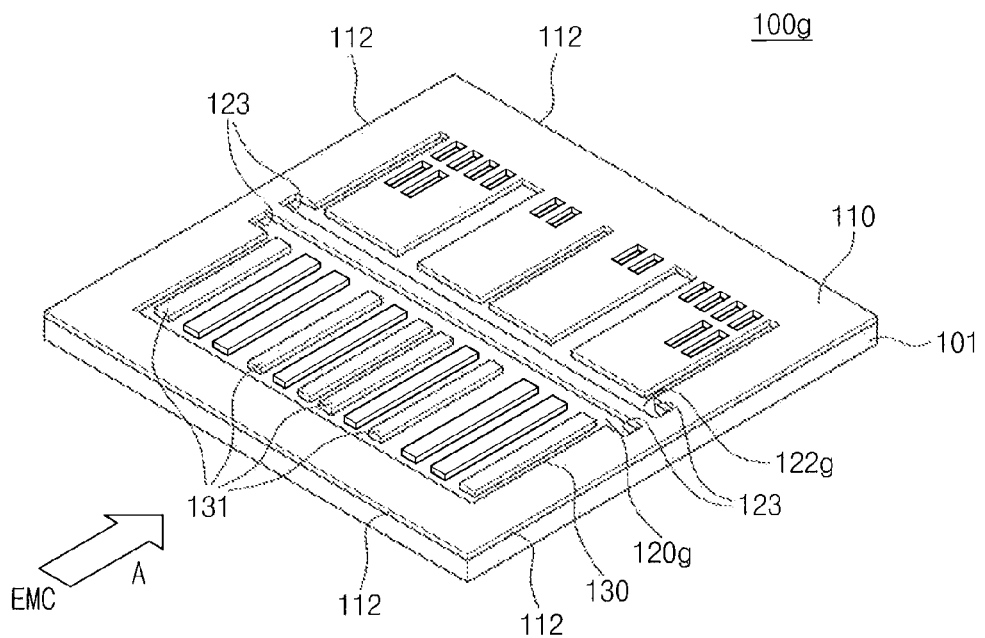

Referring to FIG. 2G, a package substrate 100g may include two '-'-shaped, i.e., linear-shaped, first opening portions 120g and 122g intersecting the center thereof. At least one of the first opening portions 120g and 122g may have an extended shape or an unextended shape. One of the first opening portions 120g and 122g, for example, the first opening portion 120g adjacent to the EMC providing side may be connected to a second opening portion 130. Further, the second opening portion 130 may include a plurality of ridges 131 to form a comb-shaped design. As another example, the first opening portion 122g may also include a plurality of ridges 131 to form a comb-shaped design.

Figure 2H:
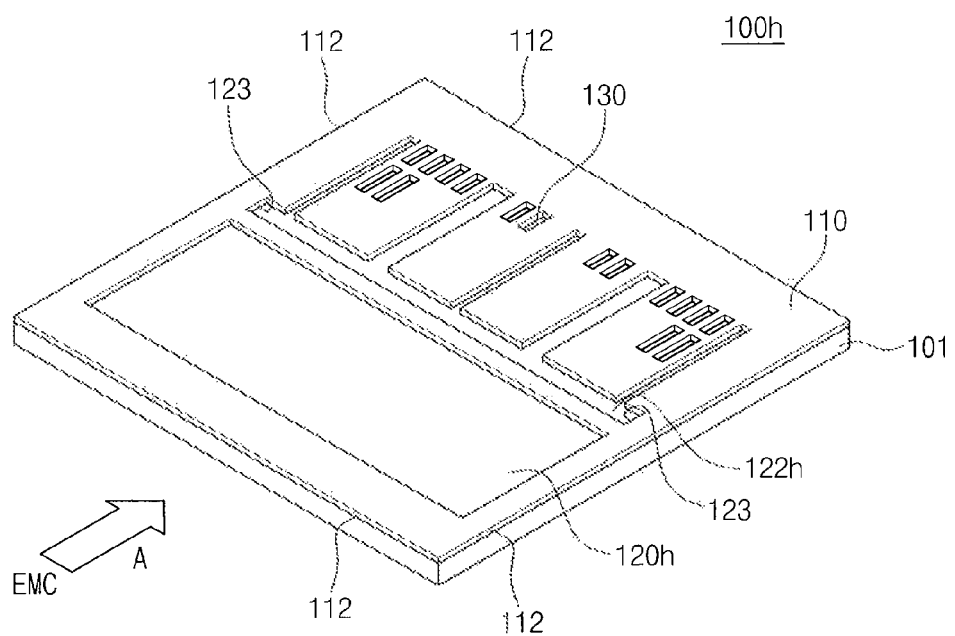

Referring to FIG. 2H, a package substrate 100h may include two first opening portions 120h and 122h. At least one of the first opening portions 120h and 122h, for example, the first opening portion 120h adjacent to the EMC providing side may have an extended tetragonal structure with an area that occupies about the half of the package substrate 100h. The extended first opening portion 120h extends the gap (G) to further improve the fluidity of the EMC. The first opening portion 122h may have a '-'s-shaped, i.e., linear-shaped, structure and may connect to a second opening portion 130, thereby improving the fluidity of the EMC and controlling the flow rate of the EMC.

Figure 2I:
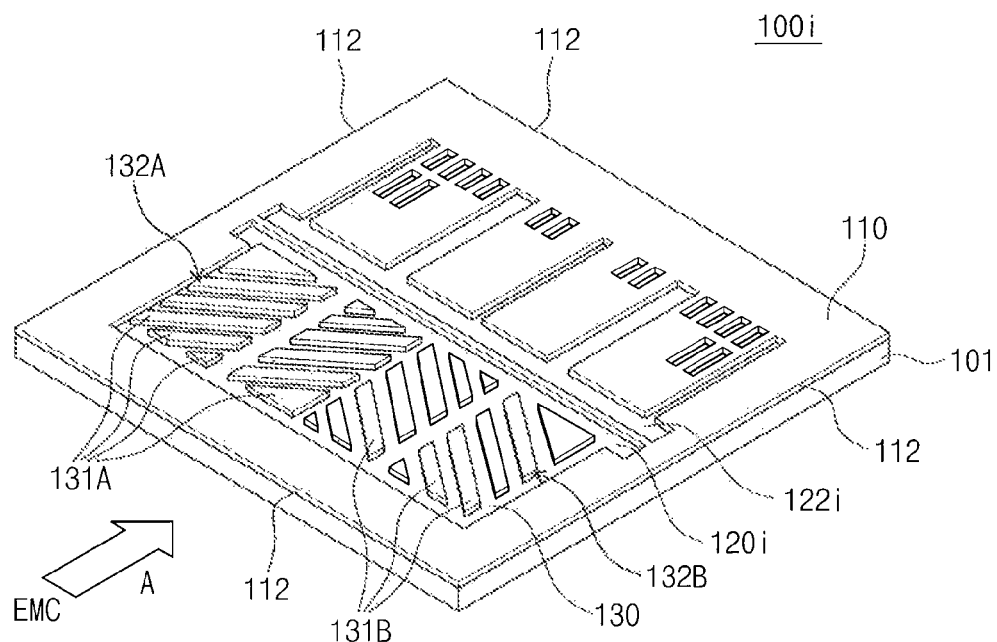

Referring to FIG. 2I, a package substrate 100i may include two '-'-shaped i.e., linear-shaped, first opening portions 120i and 122i. At least one of the first opening portions 120i and 122i, for example, the first opening portion 120i adjacent to the EMC providing side may be connected to a second opening portion 130, and the second opening portion 130 may be designed to have a comb tooth-shaped structure 132A including a plurality of ridges 131A extending in a slanting direction. The second opening portion 130 connected to the first opening portion 122i may also include a comb tooth-shaped structure 132B including a plurality of ridges 131B extending toward the first opening portion 122i. According this exemplary embodiment, the package substrate 100i may have a laterally asymmetrical structure.

Figure 2J:
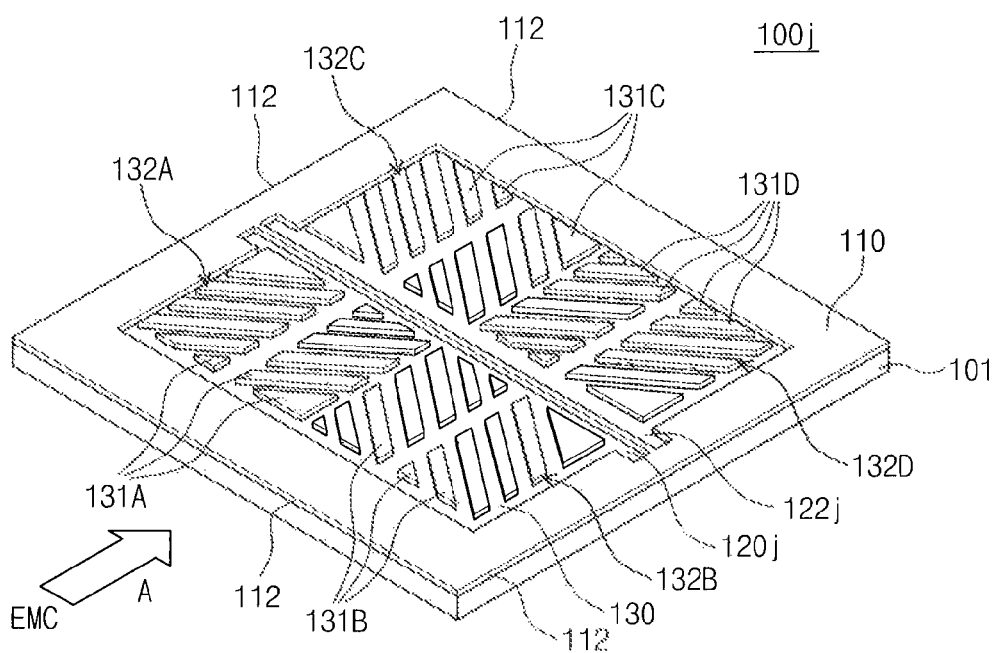

Referring to FIG. 2J, a package substrate 100j may include two shaped, i.e., linear-shaped, first opening portions 120j and 122j, and second opening portions 130 that connect to the first opening portions 120j and 122j. In addition, second opening portion 122j may also include a comb tooth-shaped structures 132C including a plurality of ridges 131C extending in a slanting direction, and also a comb tooth-shaped structure 132D including a plurality of ridges 131D extending toward the first opening portion 122i and extend in a slanting direction. According this exemplary embodiment, the package substrate 100j may have a laterally symmetrical structure.

Example of SR Dam Design

Figure 3A:
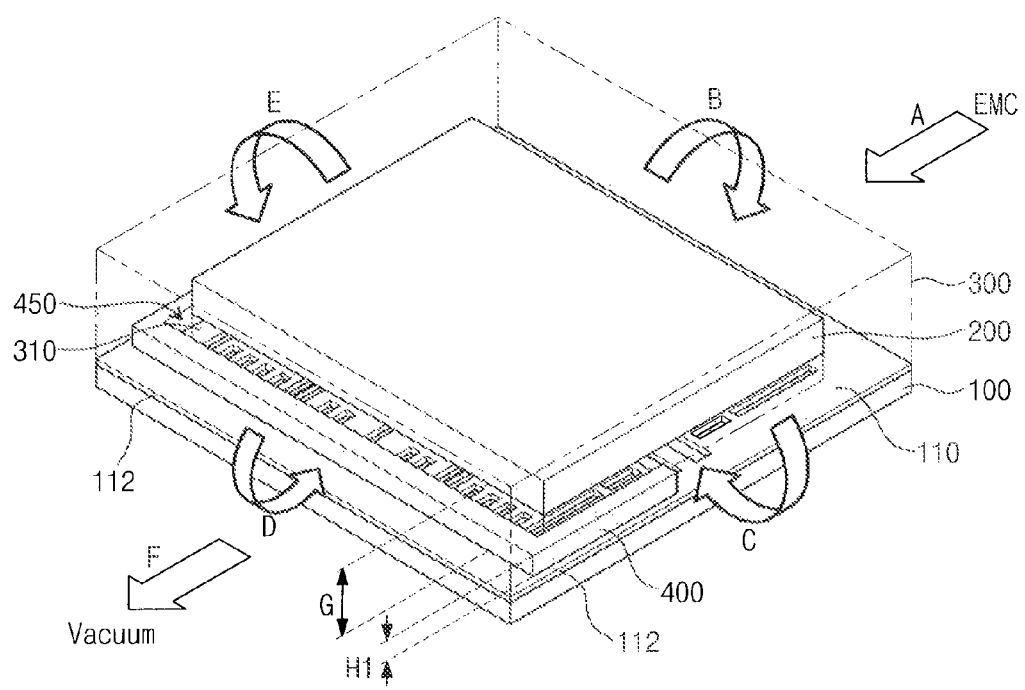
FIG. 3A is a perspective view of a semiconductor package according to other embodiments of the general inventive concept.

FIG. 3A is a perspective view of a semiconductor package according to exemplary embodiments of the general inventive concept. FIG. 36 is an exploded perspective view of FIG. 3A. A description of duplication with FIGS. 1A to 1E will be omitted for conciseness.

Figure 3B:
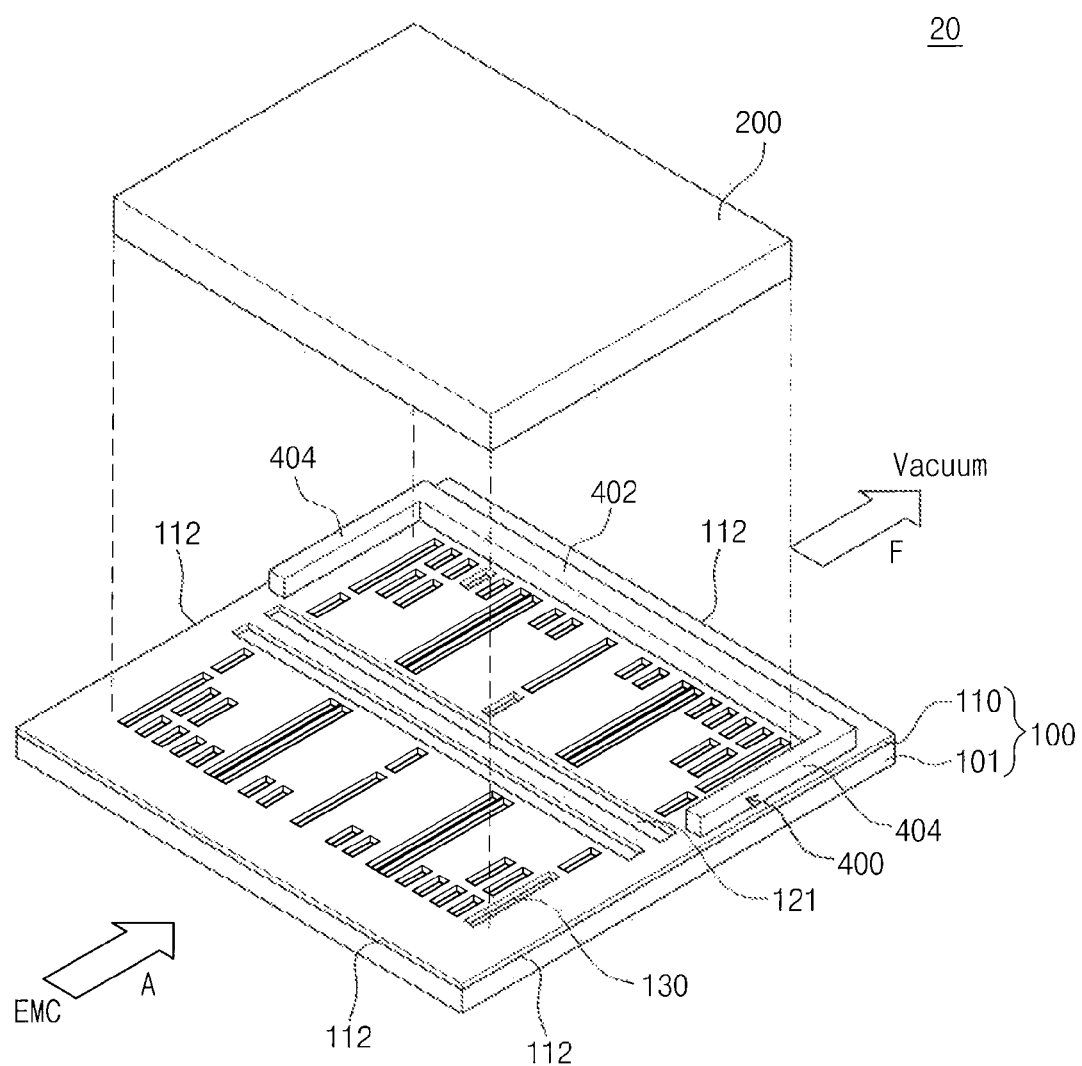
FIG. 3B is an exploded perspective view of FIG. 3A.

Referring to FIGS. 3A and 3B, a semiconductor package 20 may be a MUF flip-chip package including a package substrate 100 with a passivation layer 110 formed at the top surface thereof, a semiconductor chip 200 that is flip-mounted on the package substrate 100 and a molding layer 300 that molds the semiconductor chip 200 and has an underfilling layer 310 filling the gap (G).

An EMC may be provided by a pressure of a direction (A) and a vacuum of a direction (F) to form the molding layer 300 that molds the semiconductor chip 200. In addition, the EMC may flow in directions B to E from the top of the semiconductor chip 200 to form the underfilling layer 310 under the semiconductor chip 200.

The package substrate 100 may include at least one '-'-shaped, i.e., linear-shaped, first opening portion 121 intersecting the center thereof and a plurality of second opening portions 130 formed at the edge thereof. Unlike the first opening portion 120 of FIG. 1B, the first opening portion 121 may have an unextended structure. The package substrate 100 may further include at least one dam 400. The dam 400 may be formed on the passivation layer 110 to surround a portion of the outer wall 450 of the semiconductor chip 200. For example, the dam 400 may be designed to have a '8'-shaped structure and/or a square bracket-shaped structure at the opposite side of an EMC providing side. The dam 400 may be formed by depositing/patterning the same or similar material as the passivation layer 110 (e.g., a photo solder resist). The EMC may flow through a gap between the dam 400 and the semiconductor chip 200. The dam 400 may change the flow amount and/or the flow rate of the EMC in the gap according to the flow direction of the EMC.

The dam 400 may be formed of various shapes including, but not limited to, an L-shape and a bracket-shape. The dam 400 may include a base 402 extending along a vacuum side of the substrate 100 and perpendicular to the vacuum flow direction (F). Further the dam 400 may include at least one perpendicular side 402 extending from the base 402 and along at least one side of the substrate perpendicular to the base 402. The dam 400 may have a height H1 that may be identical to a size of the gap (G). Alternatively, the dam 400 may have a height H1 that is different from a size of the gap (G). FIG. 3A illustrates an exemplary embodiment where the height H1 of the dam 400 is smaller than the gap size G(H1<G). However, the general inventive concept is not limited thereto. For example, cases where H1=G and H1>G may also be included in the scope of the general inventive concept.

Figure 3C:
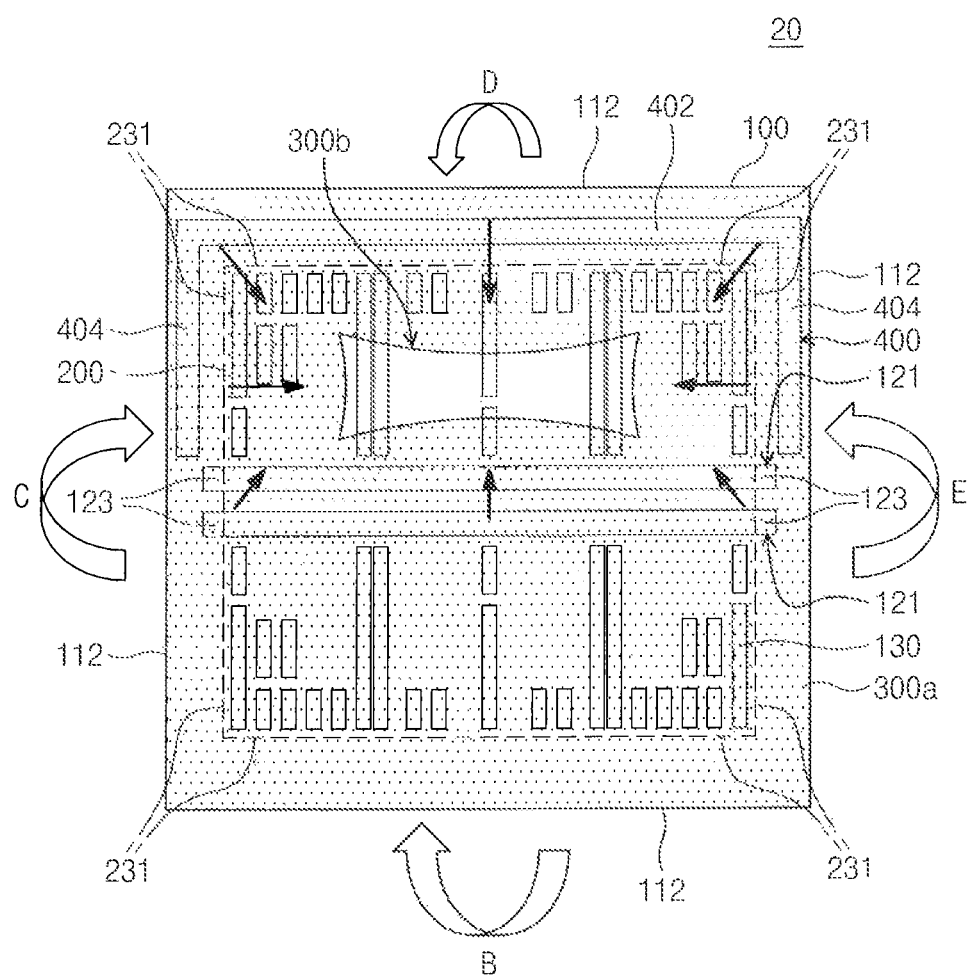
FIGS. 3C and 3D are plan views illustrating a MUF process in a semiconductor package according to other embodiments of the general inventive concept.
Figure 3D:
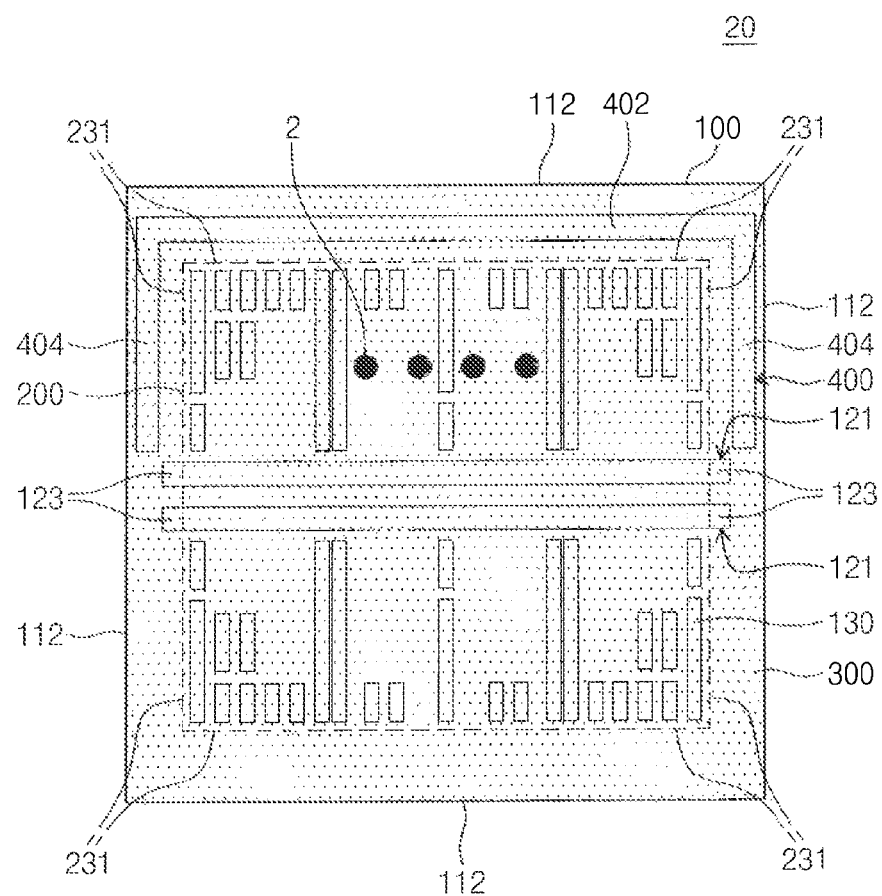

FIGS. 3C and 3D are plan views illustrating a MUF process in a semiconductor package according to exemplary embodiment of the general inventive concept.

Referring to FIG. 3C, the EMC 300a flows from four sides of the semiconductor chip 200 into the gap (G). However, the dam 400 may change the flow amount and/or the flow rate of the EMC 300a according to the flow directions. For example, the flow amount of the EMC 300a into the gap may be maximum in the direction B without the dam 400, may be minimum in the direction D with the dam 400, and may be medium in the directions C and E. Accordingly, the EMC 300a may fill the gap at non-uniform rates, and the cavity 300b may be formed more adjacent to the edge of the semiconductor chip 200 than the center of the semiconductor chip 200, i.e., the portion adjacent to the dam 400.

Referring to FIGS. 3D and 3C, the EMC 300a may continue to be provided to reduce the cavity 300b and fill the gap, thereby implementing the semiconductor package 20 that includes the molding layer 300 molding the semiconductor chip 200. Voids 2 may be generated in the gap because the EMC 300a fails to completely fill the gap. According to this embodiment, the voids 2 can be trapped at the edge of the semiconductor chip 200 because the cavity 300b is formed at the edge of the semiconductor chip 200. For example, if the semiconductor chip 200 has a center pad structure, the operation reliability of the semiconductor chip 20 may be degraded when the voids 2 are generated at the center of the semiconductor chip 200. Accordingly, at least one exemplary embodiment controls the filling of the EMC 300a by the dam 400 to guide the unavoidable voids 2 to the edge of the semiconductor chip 200, thereby preventing the reliability degradation of the semiconductor package 20.

According to at least one exemplary embodiment illustrated in FIG. 3A, the underfilling layer 310 filling the gap may be formed simultaneously during the forming of the molding layer 300. When the underfilling layer 310 and the molding layer 300 are simultaneously formed of the same material, the probability of generating a thermal stress due to the thermal expansion difference between the underfilling layer 310 and the molding layer 300 is minimized, thus securing the thermal stability of the semiconductor package 20.

Figure 3E:
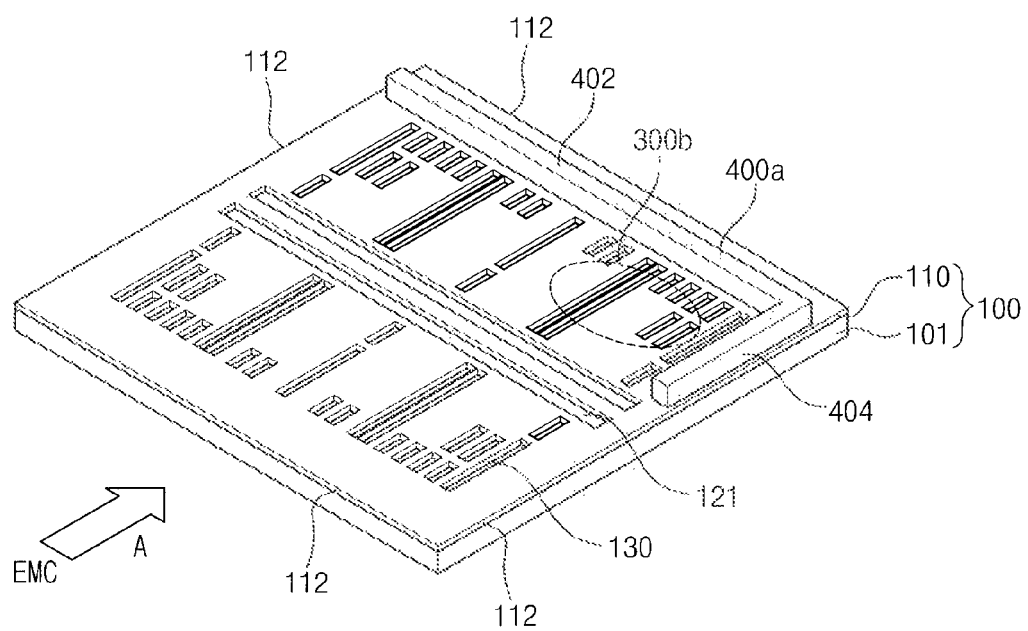
FIG. 3E is a perspective view illustrating another example of a package substrate in a semiconductor package according to other embodiments of the general inventive concept.

FIG. 3E is a perspective view illustrating another example of a package substrate in a semiconductor package according to alternative embodiments of the inventive concept.

Referring to FIG. 3E, a package substrate 100 may include a ']'-shaped dam and/or L-shaped 400a, For example, a ']'-shaped dam 400a may generate the cavity 300b at the location adjacent to the corner of the gap. Accordingly, as illustrated in FIG. 3D, the voids 2 can be generated at the edge and/or corner of the semiconductor chip 200 that does not affect the operation reliability.

Figure 4A:
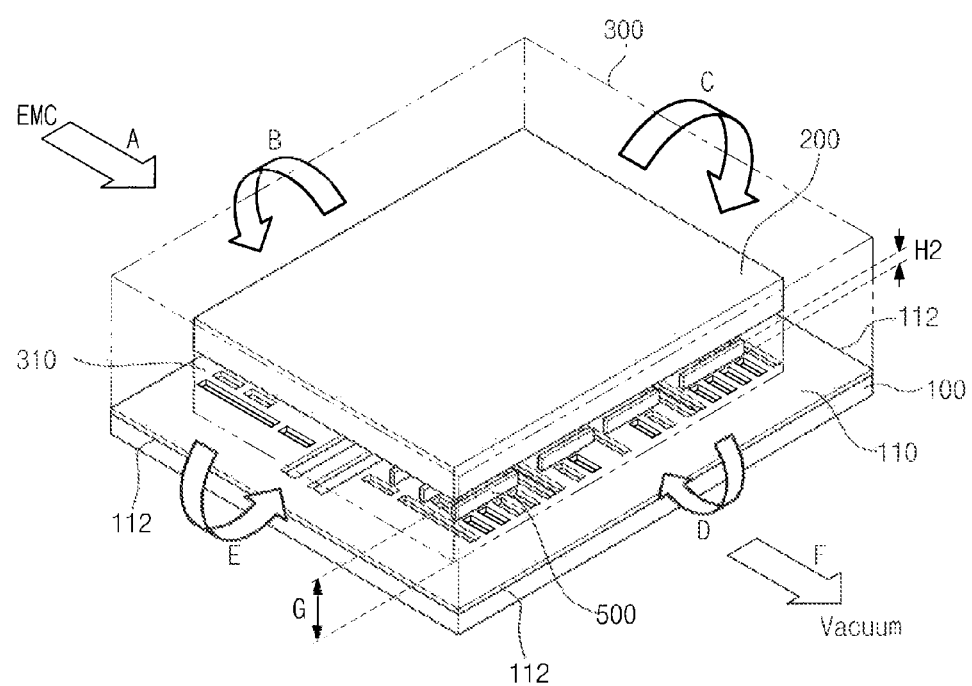
FIG. 4A is a perspective view of a semiconductor package according to further embodiments of the general inventive concept.
Figure 4B:
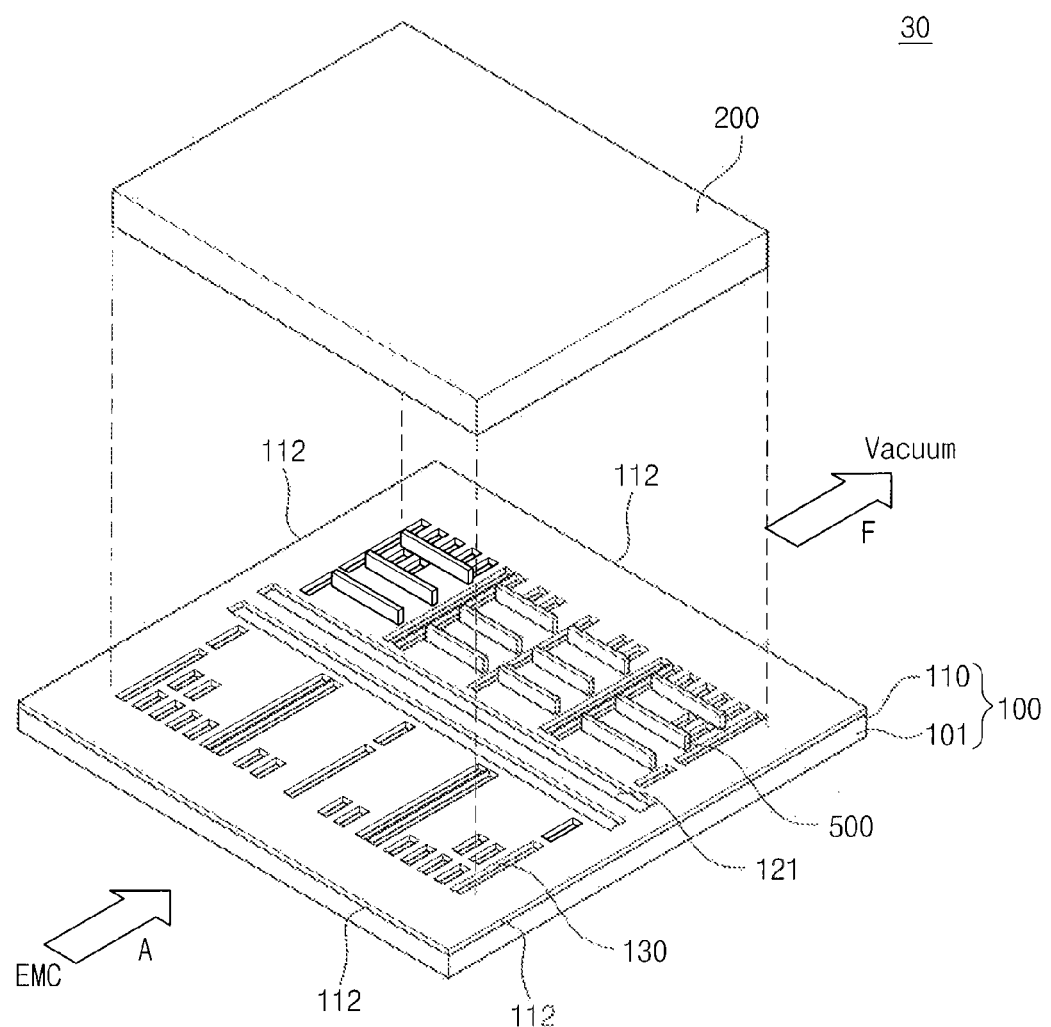
FIG. 4B is an exploded perspective view of FIG. 4A.

FIG. 4A is a perspective view of a semiconductor package according to an additional exemplary embodiment of the general inventive concept. FIG. 4B is an exploded perspective view of FIG. 4A. A description of duplication with FIGS. 1A to 1E will be omitted for conciseness.

Referring to FIGS. 4A and 4B, a semiconductor package 30 may be configured in a similar manner as the semiconductor package 20 of FIG. 3A. The semiconductor package 30 may further include a dam 500. Unlike the semiconductor package 20, the dam 500 may be disposed under the semiconductor chip 200, i.e., in the gap. The dam 500 may be disposed at the opposite side to the EMC providing side. The dam 500 may include a base 502 extending perpendicular to the EMC flow direction (A). Further, the dam 500 may include a perpendicular side 504 extending perpendicular from the base 502 to define an L-shaped dam 500a. The dam 500 may be configured to have a height H2 smaller than a gap size G so as not to prevent the fluidity of the EMC in the gap. Other configurations may be the same as illustrated in FIGS. 3A and 3B. Further, a plurality of dams 500, 500a having a plurality of shapes may be disposed on the substrate 100, as shown in FIG. 5G.

Figure 4C:
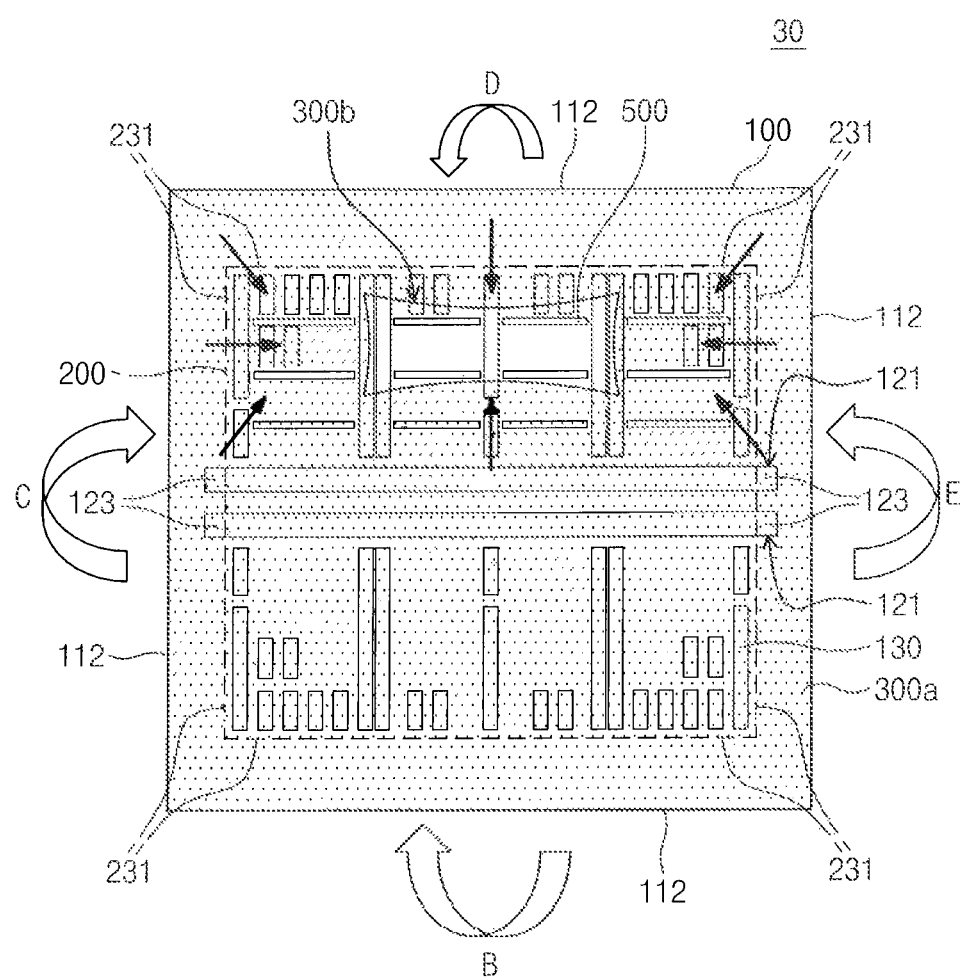
FIGS. 4C and 4D are plan views illustrating a MUF process in a semiconductor package according to further embodiments of the general inventive concept.
Figure 4D:
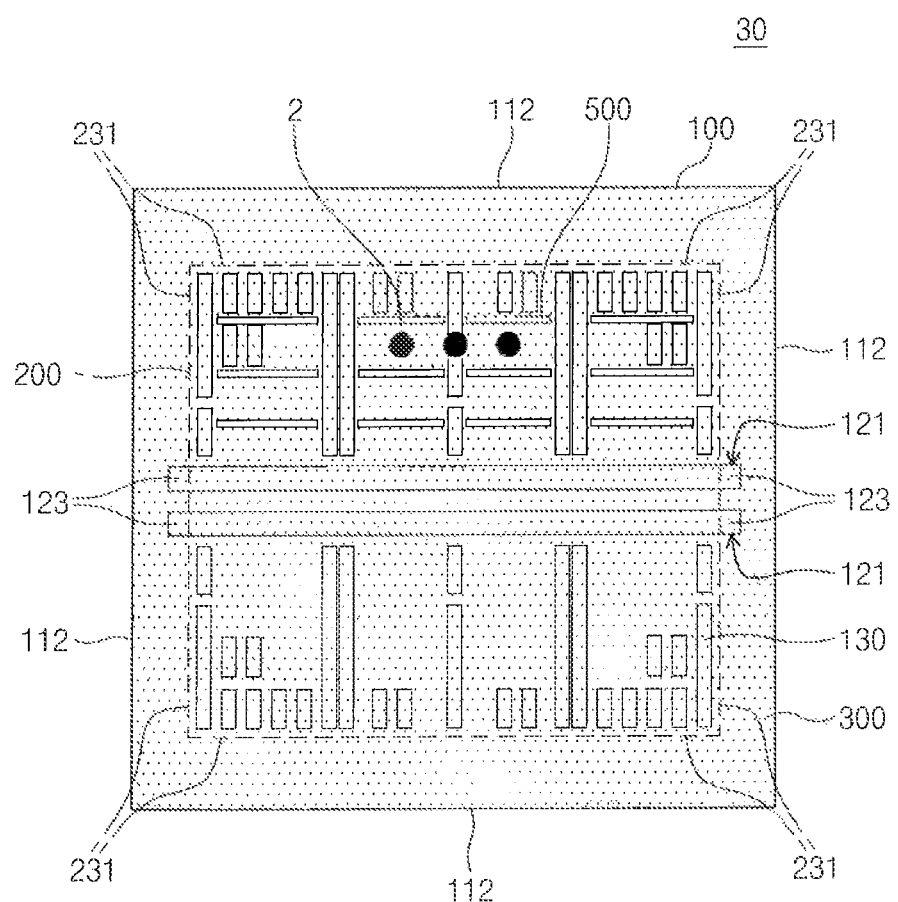

FIGS. 4C and 4D are plan views illustrating a MUF process in a semiconductor package according to further embodiments of the inventive concept.

Referring to FIG. 4C, the dam 500 may vary the flow amount of the EMC 300a according to the inflow direction. For example, the flow amount of the EMC 300a in the direction D may be smaller than those in the directions B, C and E.

Accordingly, the cavity 300b may be mainly formed adjacent to the edge of the semiconductor chip 200 corresponding to the region of the dam 500.

Referring to FIGS. 4D and 4C, the EMC 300a may continue to be provided to reduce the cavity 300b and fill the gap, thereby implementing the semiconductor package 30 that includes the molding layer 300 molding the semiconductor chip 200. The voids 2 may be trapped at the edge of the semiconductor chip 200. The other configurations may be the same as illustrated in FIGS. 3C and 3D.

Figure 4E:
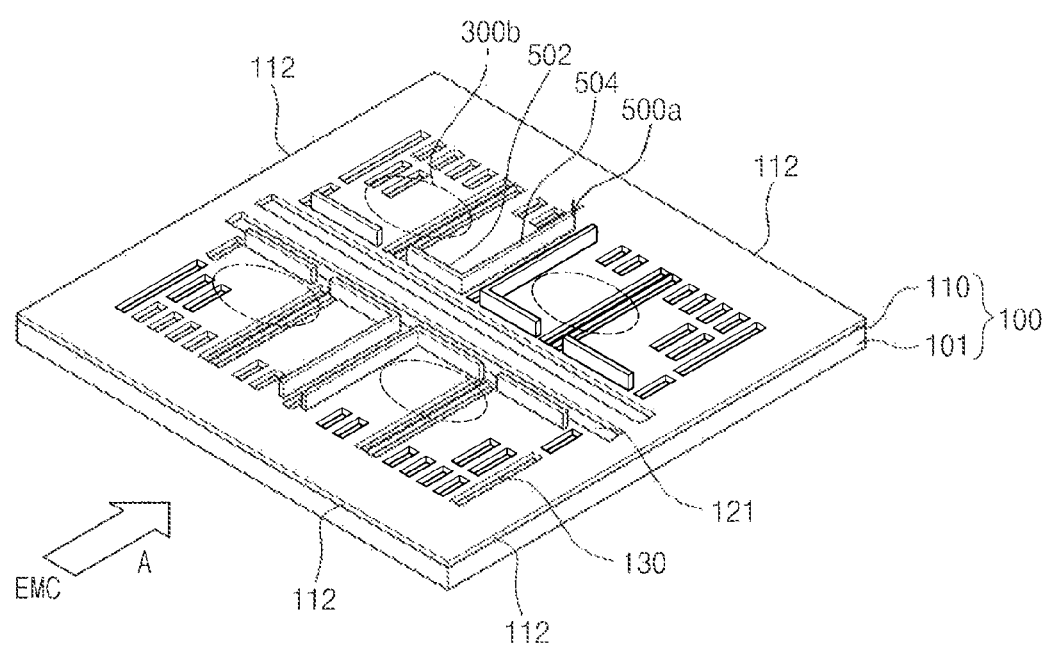
FIG. 4E is a perspective view illustrating another example of a package substrate in a semiconductor package according to further embodiments of the general inventive concept.

FIG. 4E is a perspective view illustrating another example of a package substrate in a semiconductor package according to another exemplary embodiments of the general inventive concept.

Referring to FIG. 4E, a package substrate 100 may include a ']'-shaped and/or L-shaped dam 500a. For example, an ']'-shaped dam 500a may generate the cavity 300b at the location deviating from the center of the semiconductor chip 100. Accordingly, the voids 2 may be contained at other points than the edge of the semiconductor chip 200.

Example of SR Open+SR Dam Design

Figure 5A:
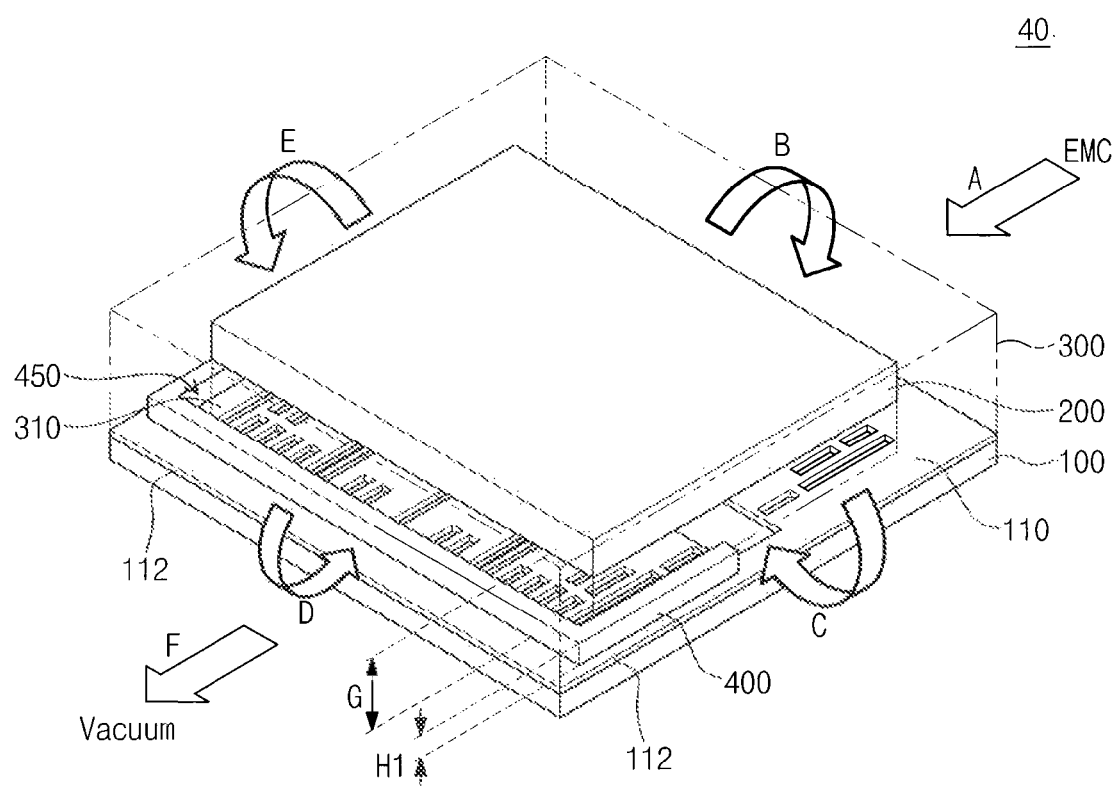
FIG. 5A is a perspective view of a semiconductor package according to still further embodiments of the general inventive concept.
Figure 5B:
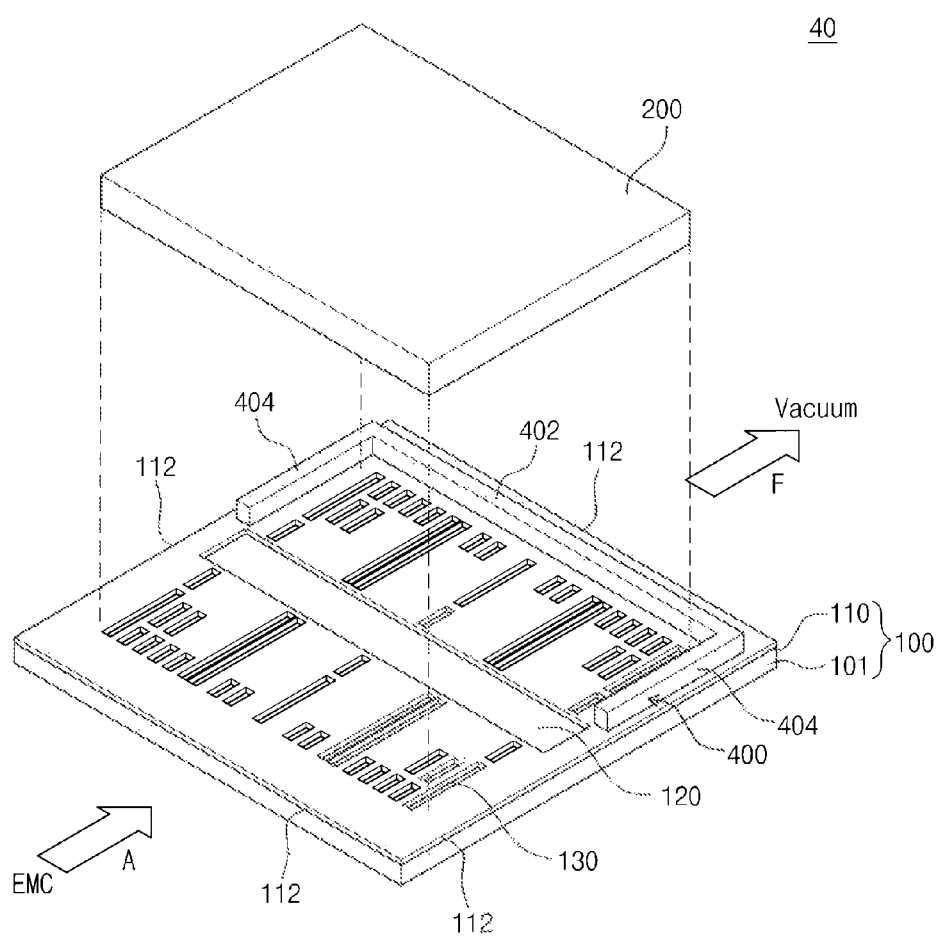
FIG. 5B is an exploded perspective view of FIG. 5A.

FIG. 5A is a perspective view of a semiconductor package according to yet further exemplary embodiments of the general inventive concept. FIG. 5B is an exploded perspective view of FIG. 5A. A description of duplication with FIGS. 1A to 1E will be omitted for conciseness.

Referring to FIGS. 5A and 5B, a semiconductor package 40 may be a MUF flip-chip package that includes a molding layer 300 molding a semiconductor chip 300 mounted on a package substrate 100. The package substrate 100 may include a first opening portion 120 capable of improving the fluidity of an EMC and a dam 400 capable of shifting the generation location of voids. The design of the opening portion of the package substrate 100 may be identical or similar to that described with reference to FIGS. 1A and 1B, and the dam 400 may be identical or similar to that described with reference to FIGS. 3A and 3B. According to this exemplary embodiment, the fluidity of the EMC can be improved by the design of the opening portion of the package substrate 100, so that the molding layer 300 including the void-free underfilling layer 310 can be formed. In addition, the dam 400 can change the fluidity of the EMC, so that voids 2 can be shifted to a location (e.g., the edge of the semiconductor chip 200) that does not affect the operation of the semiconductor chip 200.

Figure 5C:
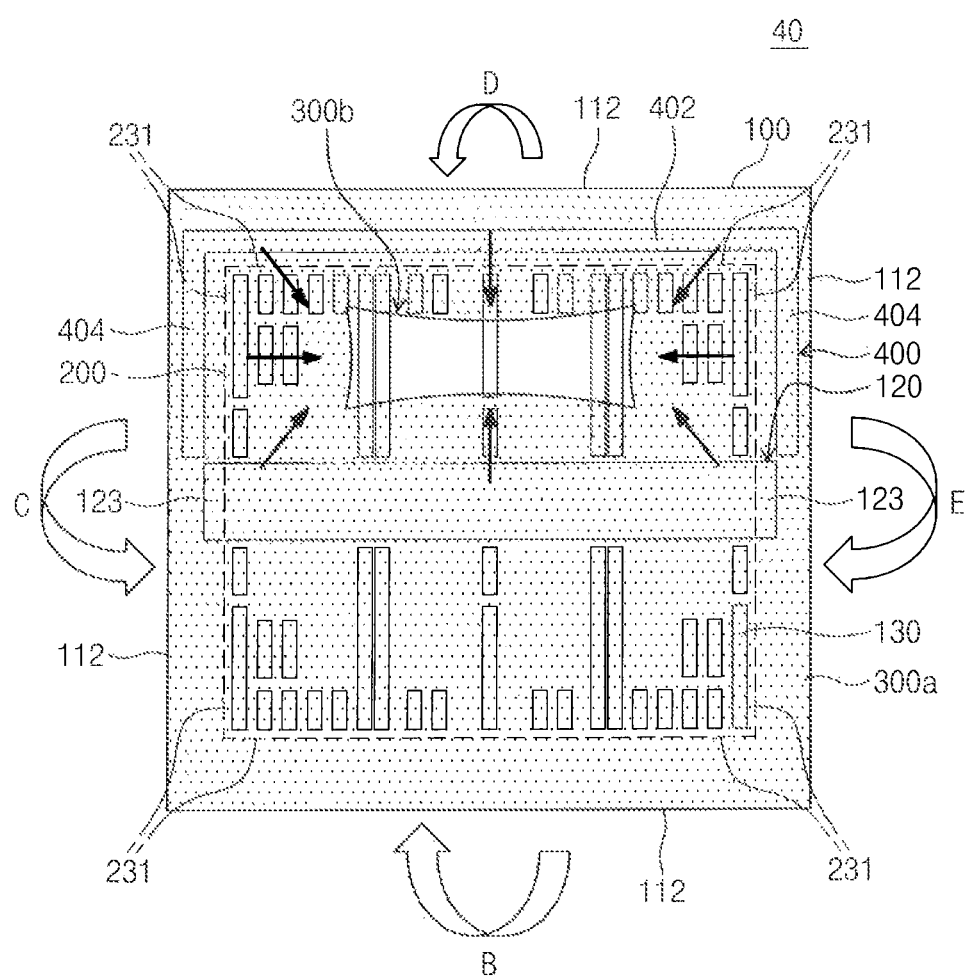
FIGS. 5C and 5D are plan views illustrating a MUF process in a semiconductor package according to still further embodiments of the general inventive concept.
Figure 5D:
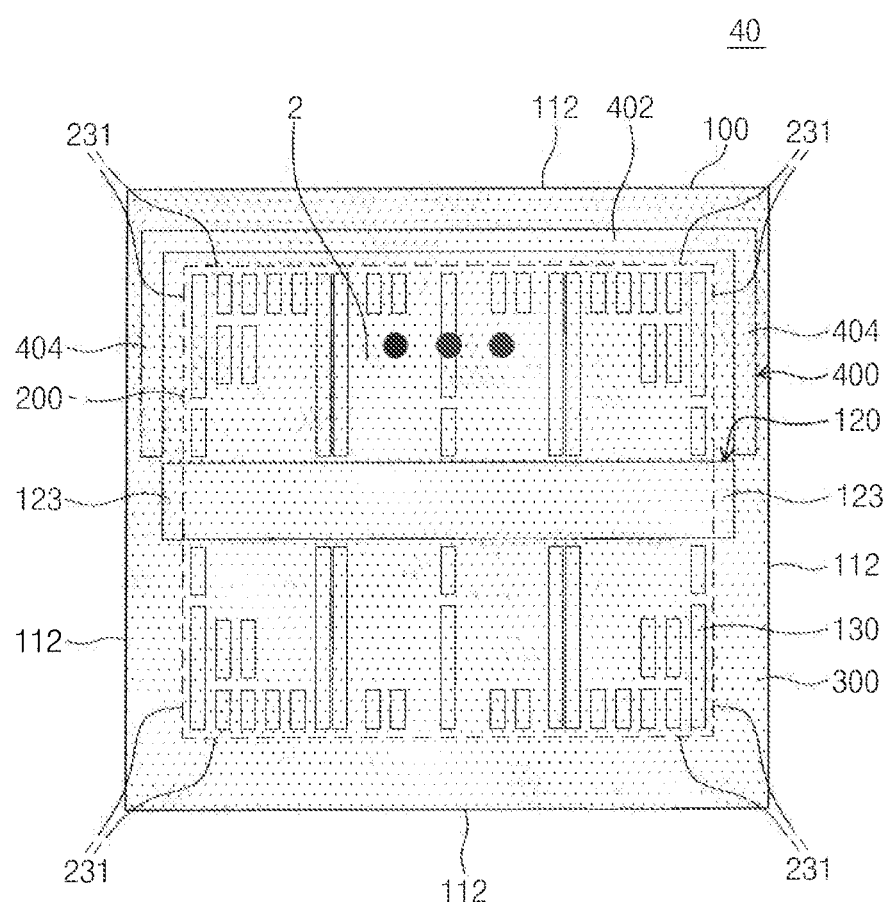

FIGS. 5C and 5D are plan views illustrating a MUF process in a semiconductor package according to still further exemplary embodiments of the general inventive concept.

Referring to FIG. 5C, the extended first opening portion 120 may increase a gap size to improve the fluidity of an EMC 300a, and the dam 400 may vary the flow amount of the EMC 300a according to the inflow direction. For example, the flow amount of the EMC 300a in the direction D may be smaller than those in the directions B, C and E. Accordingly, the cavity 300b may be mainly formed adjacent to the edge of the semiconductor chip 200 corresponding to the region of the dam 400.

Referring to FIGS. 5D and 5C, the EMC 300a may continue to be provided to reduce the cavity 300b and fill the gap, thereby implementing the semiconductor package 40 that includes the molding layer 300 molding the semiconductor chip 200. The voids 2 may be contained at the edge of the semiconductor chip 200.

Figure 5E:
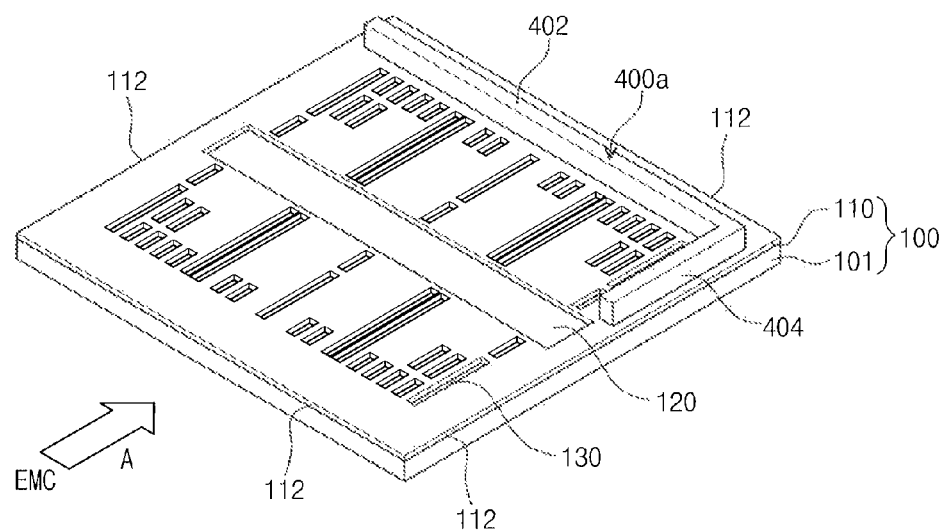
FIGS. 5E to 5G are perspective views illustrating various examples of a package substrate in a semiconductor package according to still further embodiments of the general inventive concept.
Figure 5F:
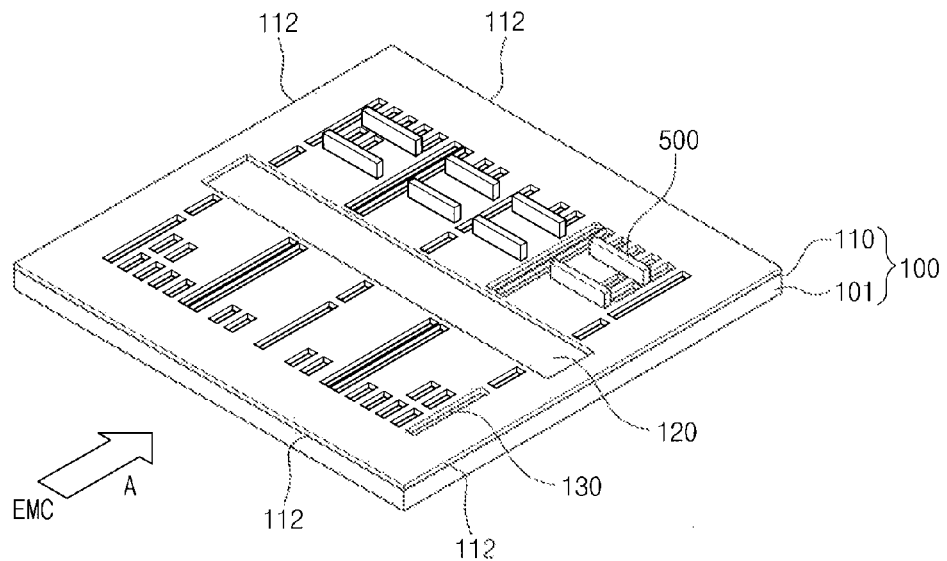
Figure 5G:
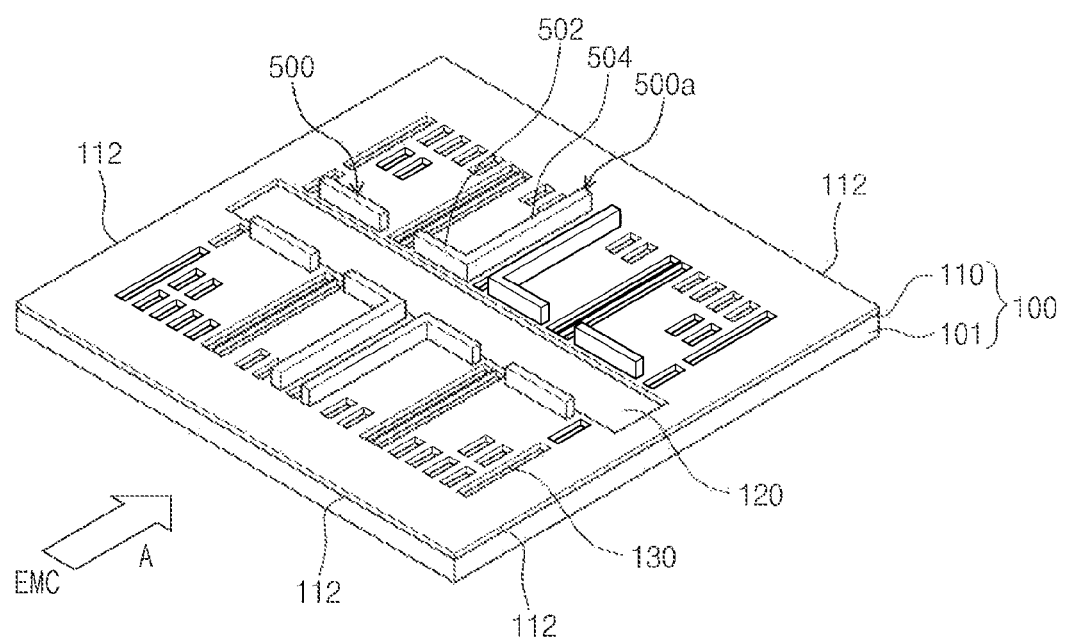

FIGS. 5E to 5G are perspective views illustrating various examples of a package substrate in a semiconductor package according to still further exemplary embodiments of the general inventive concept.

Referring to FIG. 5E, a package substrate 100 may include a '-'-shaped and/or linear-shaped extended first opening portion 120 intersecting the center thereof, and a ']'-shaped and/or L-shaped dam 400a. The structures of the first opening portion 120 and the second opening portion 130 may vary in the same or similar manner as described with reference to FIGS. 2A to 2J. The same is true in the following description. In the same or similar manner as the dam 400 described with reference to FIGS. 3C and 3D, the dam 400a can shift the voids 2 to a location (e.g., the corner of the semiconductor chip 200) that does not affect the operation of the semiconductor chip 200.

Referring to FIG. 5F, a package substrate 100 may include an extended first opening portion 120 and a dam 500 described with reference to FIGS. 3A and 3B. The dam 500 may be formed in the gap to shift the generation of voids. As another example, in addition to the dam 500 formed in the gap, the package substrate 100 may further include the dam 400 identical or similar to that illustrated in FIG. 5B, or the dam 400a identical or similar to that illustrated in FIG. 5E.

Referring to FIG. 5G, a package substrate 100 may include an extended first opening portion 120 and a ']'-shaped and/or L-shaped dam 500a disposed in the gap as illustrated in FIG. 4E. The dam 500a may shift the location where of voids 2 may be contained.

Example of Application

Figure 6A:
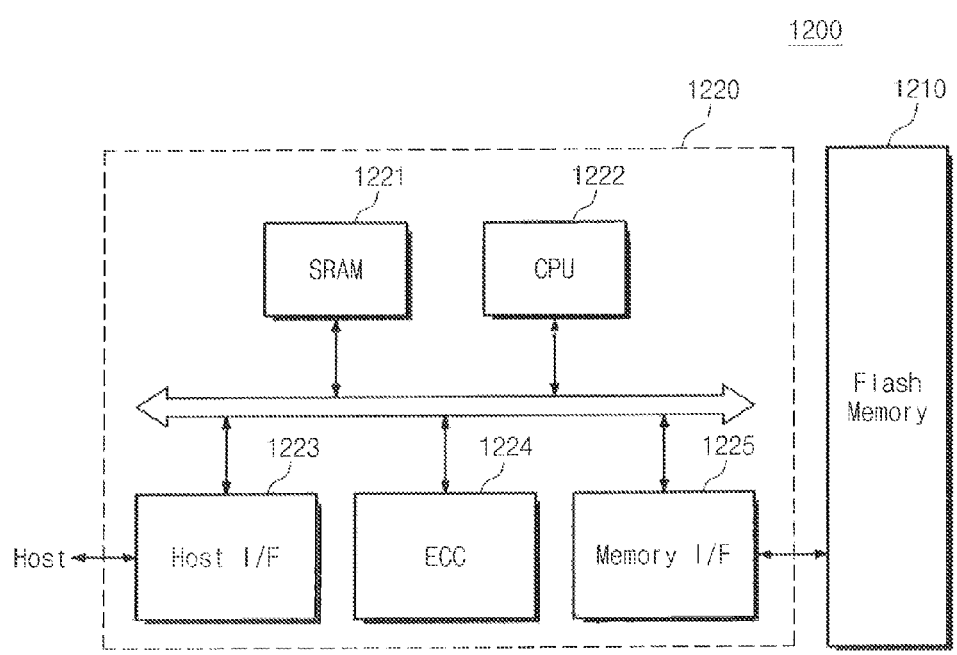
FIG. 6A is a block diagram of a memory card having a semiconductor package according to some embodiments of the general inventive concept.

FIG. 6A is a block diagram of a memory card having a semiconductor package according to further exemplary embodiments of the general inventive concept.

Referring to FIG. 6A, a memory card 1200 may include a flash memory 1210 to support a high data storage capacity. The flash memory 1210 may be packaged in the same or similar way as the semiconductor package according to the above exemplary embodiment of the general inventive concept.

The memory card 1200 may include a memory controller 1220 that controls data exchange between a host and the flash memory 1210. An SRAM 1221 may be used as a working memory of a central processing unit (CPU) 1222. A host interface 1223 may have the data exchange protocol of the host connected to the memory card 1200. An error correction code (ECC) 1224 may detect/correct an error in data read from the flash memory 1210. A memory interface 1225 may interface with the flash memory 1210. The CPU 1222 may perform an overall control operation to exchange data to and/or from the memory controller 1220. Although not illustrated in FIG. 6A, the memory card 1200 may further include a read-only memory (ROM) storing code data to interface with the host.

Figure 6B:
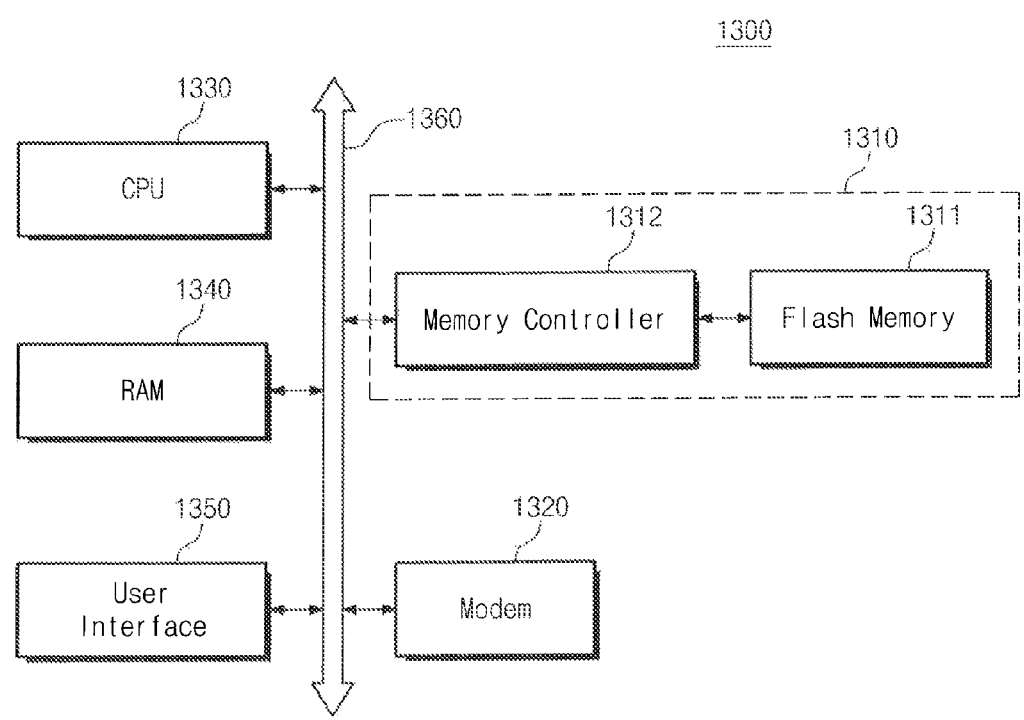
FIG. 6B is a block diagram of an information processing system according to some embodiments of the inventive concept.

FIG. 6B is a block diagram of an information processing system according to still further exemplary embodiments of the general inventive concept.

Referring to FIG. 6B, an information processing system 1300 may include a flash memory system 1310 having a flash memory device (e.g., a NAND flash memory device) packaged in the same or similar way as the semiconductor package according to an exemplary embodiment of the general inventive concept. The information processing system 1300 may include a mobile device or a computer.

For example, the information processing system 1300 may include a flash memory system 1310, a modem 1320, a central processing unit (CPU) 1330, a random-access memory (RAM) 1340, and a user interface 1350 that are electrically connected to a system bus 1360. The flash memory system 1310 may store data that are processed by the CPU 1330 or received from an external device. The information processing system 1300 may be stored on a memory card, a solid state disk (SSD), a camera image processor, and other application chipsets. For example, the flash memory system 1310 may be configured as an SSD. In this case, the information processing system 1300 may store massive data in the flash memory system 1310 stably and reliably.

Figure 7:
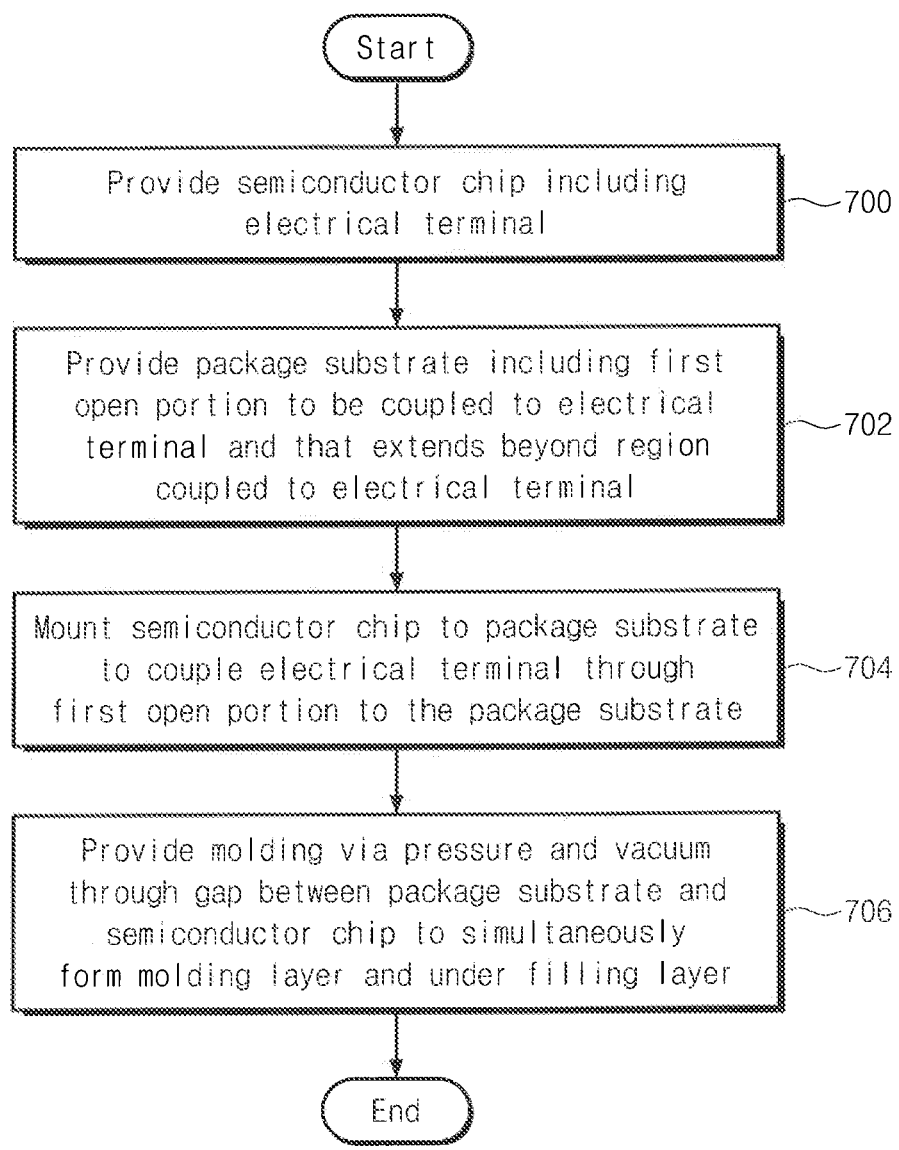
FIG. 7 is a flowchart illustrating an exemplary method of fabricating a semiconductor package according to the general inventive concept.

Referring to FIG. 7, a flowchart illustrates an exemplary method of fabricating a semiconductor package according to the general inventive concept.

At operation 700, a semiconductor chip is provided, which includes at least one electrical connection terminal. At operation 702, a package substrate is provided, which includes a first opening portion to be coupled to the at least one electrical connection terminal of the semiconductor chip. The first opening portion is formed such that it and that extends beyond a region coupled to the electrical connection terminal. At operation 704, the semiconductor chip is mounted on the package substrate to couple the at least one electrical connection terminal to the package substrate via through the first opening portion. The method proceeds to operation 706 where a molding resin driven by a pressure and vacuum environment is provided to a gap formed between the package substrate and the semiconductor chip. Accordingly a molding layer molding the semiconductor chip is formed, where the molding resin forms an underfilling layer, which fills the gap while the of the molding layer is formed, and the method ends.

As described above, at least one exemplary embodiment of the present general inventive concept provides an extended opening portion at the package substrate to improve the fluidity of the molding resin, thereby making it possible to implement the void-free underfilling layer. Also, the present general inventive concept disposes at least one dam at the package substrate and/or disposes the dam together with the extended opening portion to change the fluidity of the molding resin, thereby making it possible to shift the unavoidable voids to a location that may not affect the operation of the semiconductor chip. Accordingly, the present general inventive concept may improve the operation reliability of the semiconductor chip and the semiconductor package. Also, the present general inventive concept forms the molding layer and the underfilling layer simultaneously by the MUF process using a pressure and a vacuum, thereby making it possible to improve the productivity and yield and to implement the semiconductor package having excellent durability and electrical characteristics.

Although a few exemplary embodiments of the present general inventive concept have been shown and described, it would be appreciated by those skilled in the art that changes may be made in these exemplary embodiments without departing from the principles and spirit of the general inventive concept, the scope of which is defined in the claims and their equivalents.

What is claimed is:

1. A package substrate comprising:
   a substrate mounted with a semiconductor chip including a plurality of sides defining an outer peripheral; and
   a passivation layer disposed on the substrate and having a first opening portion to provide access for electrical connection to the semiconductor chip,
   wherein the first opening portion extends beyond at least one side among the plurality of sides of the semiconductor chip, and
   wherein the passivation layer further includes a second opening portion to provide access for mechanical connection to the semiconductor chip and which is insulated from electrical connection.

2. The package substrate of claim 1, wherein the first opening portion intersects the center of the substrate in one direction.

3. The package substrate of claim 1, wherein the second opening portion occupies an edge portion of the substrate.

4. The package substrate of claim 3, wherein the first opening portion is connected to the second opening portion to extend to the edge portion of the substrate, or is defined in a center portion of the substrate without being connected to the second opening portion.

5. The package substrate of claim 1, further comprising one of a first dam disposed on the passivation layer to occupy an edge portion of the substrate to surround a portion of the outer wall of the semiconductor chip, and a second dam disposed under the semiconductor chip.

6. A semiconductor package comprising:
a semiconductor chip including a plurality of sides defining an outer peripheral;
a package substrate providing a region mounted with the semiconductor chip; and
a molding layer configured to mold the semiconductor chip,
wherein the package substrate includes a first opening portion to provide access for electrical connection to the semiconductor chip and that extends beyond at least one side among the plurality of sides of the semiconductor chip.

7. The semiconductor package of claim 6, wherein the semiconductor chip includes a first surface with an electrical connection terminal and a support terminal disposed thereon and a second surface opposite to the first surface, and is flip-mounted on the package substrate with the first surface facing the package substrate.

8. The semiconductor package of claim 7, wherein the electrical connection terminal is provided in plurality across the center of the semiconductor chip, and the first opening portion is disposed across the center of the package substrate while being vertically aligned with the electrical connection terminals.

9. The semiconductor package of claim 7, wherein the support terminal is provided in plurality at the edge of the semiconductor chip, and the package substrate further includes a plurality of second opening portions aligned vertically with the support terminals.

10. The semiconductor package of claim 9, wherein the first opening portion is connected to at least one of the second opening portions.

11. The semiconductor package of claim 9, wherein the package substrate includes a passivation layer, and the first and second opening portions are formed by removing a portion of the passivation layer.

12. The semiconductor package of claim 6, wherein the package substrate further includes one of a first dam surrounding a portion of the outer wall of the semiconductor chip, and a second dam disposed under the semiconductor chip.

13. The semiconductor package of claim 12, wherein the first dam has a height identical to or different from the size of a gap between the package substrate and the semiconductor chip, and is disposed at the edge of the package substrate to be spaced apart from the side of the semiconductor chip.

14. The semiconductor package of claim 12, wherein the second dam has a height smaller than the size of a gap between the package substrate and the semiconductor chip, and is disposed on the package substrate to be spaced apart from the first opening portion.

15. The semiconductor package of claim 6, wherein the molding layer includes an underfilling layer filling a gap between the semiconductor chip and the package substrate, and the underfilling layer is formed of the same material as the molding layer.

16. A semiconductor package comprising:
a semiconductor chip including a top surface with an electrical connection terminal and a support terminal disposed thereon and a bottom surface opposite to the top surface;
a package substrate mounted with a semiconductor chip including a plurality of sides defining an outer peripheral;
a passivation layer disposed on the package substrate and having a first opening portion to provide access for electrical connection to the semiconductor chip,
wherein the first opening portion extends beyond at least one side among the plurality of sides of the semiconductor chip; and
a molding layer molding the semiconductor chip and filling a gap between the semiconductor chip and the package substrate,
wherein the package substrate further includes a second opening portion connected to the support terminal, and
wherein the semiconductor chip is disposed such that the top surface faces the package substrate, the electrical connection terminal is electrically connected through the first opening portion to the package substrate, and the support terminal is connected through the second opening portion to the package substrate to mechanically support the semiconductor chip on the package substrate.

17. The semiconductor package of claim 16, wherein the first opening portion has the shape of a straight line that extends in one direction across the center of the package substrate.

18. The semiconductor package of claim 17, wherein the first opening portion is connected to the second opening portion to further extend to the edge of the package substrate.

19. The semiconductor package of claim 16, wherein the package substrate further includes a dam disposed on the passivation layer, and
the dam is disposed outside the gap to surround a portion of the outer wall of the semiconductor chip while being spaced apart from the side of the semiconductor chip, or is disposed in the gap under the semiconductor chip.

20. The semiconductor package of claim 16, wherein the molding layer includes an underfilling layer filling the gap, and the underfilling layer includes voids trapped at a point deviating from the first opening portion.

21. A substrate including a semiconductor chip having a plurality of sides defining an outer periphery thereof, the substrate comprising:
a passivation layer disposed thereon, the passivation layer including:
an edge connection region formed within boundary edges of the passivation layer to have a perimeter equal to the outer periphery of the semiconductor chip; and
at least one center portion formed therein along a width of the passivation layer to extend path both opposing sides of the edge connection region.

22. The substrate of claim 21, wherein the at least one center portion extends through the center of the edge connection region to provide electrical connection from the semiconductor chip through the passivation layer.

23. The substrate of claim 22, wherein the at least one center portion includes at least one excess portion disposed between an edge of the substrate and the edge connection region to connect electrically to the semiconductor chip.

24. The substrate of claim 23, further comprising:
a plurality of terminals disposed within the at least one center opening portion 25. The substrate of claim 22, wherein the at least one center portion includes first and second excess portions located at opposing ends of the at least one center opening portion to connect electrically to the semiconductor chip, and
wherein a plurality of terminals are disposed in the at least one center opening portion between the first and second excess portions.

26. A package substrate comprising:
a passivation layer including a first open region extending therethrough and a second open region that is insulated from electrical connection;
at least one dam having a predetermined height and being formed on the passivation layer; and
a chip disposed on the at least one dam to define a gap between the chip and the passivation layer.

27. A package substrate comprising:
a passivation layer including an open region extending therethrough;
at least one dam having a predetermined height and being formed on the passivation layer; and
a chip disposed on the at least one dam to define a gap between the chip and the passivation layer, wherein the dam includes at least one of a linear-shape, an L-shape and a square bracket-shape to change at least one of a flow amount and a flow rate of molding resin flowing through the gap in an EMC flow direction.

* * * * *